US010553621B2

(12) United States Patent
Hu et al.

(10) Patent No.: US 10,553,621 B2
(45) Date of Patent: Feb. 4, 2020

(54) THIN-FILM TRANSISTOR STRUCTURE AND MANUFACTURING METHOD THEREOF, DISPLAY PANEL AND DISPLAY DEVICE

(71) Applicant: BOE TECHNOLOGY GROUP CO., LTD., Beijing (CN)

(72) Inventors: Hehe Hu, Beijing (CN); Wei Yang, Beijing (CN); Xinhong Lu, Beijing (CN); Ke Wang, Beijing (CN); Yu Wen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/302,850

(22) PCT Filed: Mar. 13, 2018

(86) PCT No.: PCT/CN2018/078869
§ 371 (c)(1),
(2) Date: Nov. 19, 2018

(87) PCT Pub. No.: WO2019/019658
PCT Pub. Date: Jan. 31, 2019

(65) Prior Publication Data
US 2019/0267409 A1    Aug. 29, 2019

(30) Foreign Application Priority Data
Jul. 28, 2017   (CN) .......................... 2017 1 0629740

(51) Int. Cl.
*H01L 27/12*       (2006.01)
*H01L 29/66*       (2006.01)
(Continued)

(52) U.S. Cl.
CPC ...... *H01L 27/1248* (2013.01); *H01L 27/1225* (2013.01); *H01L 27/1251* (2013.01);
(Continued)

(58) Field of Classification Search
CPC ............. H01L 27/1222; H01L 27/1225; H01L 27/1251; H01L 29/7869; H01L 29/78693
See application file for complete search history.

(56) References Cited

U.S. PATENT DOCUMENTS

2001/0015430 A1    8/2001  Hartner et al.
2008/0224195 A1    9/2008  Wang et al.
(Continued)

FOREIGN PATENT DOCUMENTS

CN         1303128 A     7/2001
CN       101322241 A    12/2008
(Continued)

OTHER PUBLICATIONS

First Chinese Office Action dated Jun. 14, 2019.
International Search Report and Written Opinion dated Jun. 20, 2018 from State Intellectual Property Office of the P.R. China.

*Primary Examiner* — Daniel P Shook
(74) *Attorney, Agent, or Firm* — Dilworth & Barrese, LLP; Michael J. Musella, Esq.

(57) ABSTRACT

Embodiment of the present disclosure provide a thin-film transistor structure, a manufacturing method thereof, a display panel and a display device. The thin-film transistor structure includes: a base substrate; and a first thin-film transistor and a second thin-film transistor formed on the base substrate, wherein a first active layer of the first thin-film transistor is doped with hydrogen; a material of a second active layer of the second thin-film transistor is metal oxide; and a first isolation barrier surrounding the first thin-film transistor and/or a second isolation barrier surrounding the second thin-film transistor are disposed on the base substrate.

18 Claims, 13 Drawing Sheets

(51) Int. Cl.
*H01L 29/786* (2006.01)
*H01L 27/32* (2006.01)

(52) U.S. Cl.
CPC .... *H01L 27/1259* (2013.01); *H01L 29/66757* (2013.01); *H01L 29/66969* (2013.01); *H01L 29/7869* (2013.01); *H01L 29/78675* (2013.01); *H01L 27/3262* (2013.01)

(56) References Cited

U.S. PATENT DOCUMENTS

| | | |
|---|---|---|
| 2009/0008750 A1 | 1/2009 | Tokitoh |
| 2011/0024774 A1 | 2/2011 | Tredwell et al. |
| 2017/0117304 A1* | 4/2017 | Kim .................... H01L 27/1251 |

FOREIGN PATENT DOCUMENTS

| | | |
|---|---|---|
| CN | 101339924 A | 1/2009 |
| CN | 104025269 A | 9/2014 |
| CN | 106876412 A | 6/2017 |
| CN | 107452756 A | 12/2017 |
| KR | 1020150061076 A | 6/2015 |
| KR | 20170049666 A | 5/2017 |

\* cited by examiner

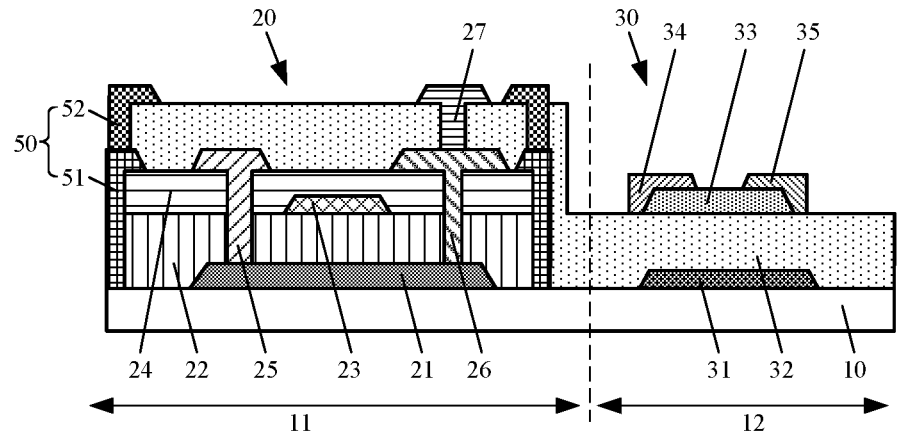
FIG. 3
S1 — Forming the first TFT, the second TFT and the isolation barrier on the base substrate, wherein the first active layer of the first TFT is doped with hydrogen; the second TFT is a metal oxide TFT; and the isolation barrier surrounds the second TFT
FIG. 4
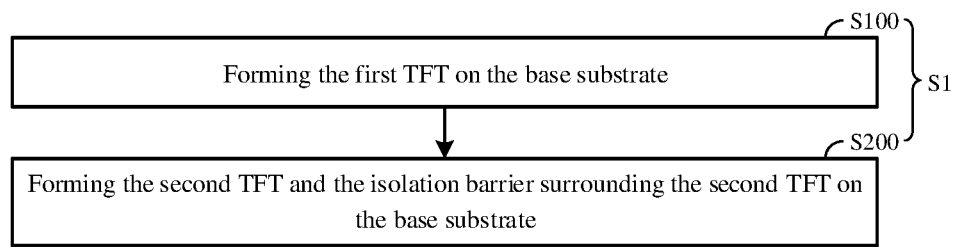
FIG. 5

THIN-FILM TRANSISTOR STRUCTURE AND MANUFACTURING METHOD THEREOF, DISPLAY PANEL AND DISPLAY DEVICE

TECHNICAL FIELD

The present disclosure relates to a thin-film transistor structure, a manufacturing method thereof, a display panel and a display device.

BACKGROUND

As an important switching control element, a thin-film transistor plays a key role in the display device. In the prior art, for making a display device have better image display quality, a thin-film transistor (TFT) structure is usually disposed in a display panel of the display device. The TFT structure includes two types of TFTs, in which one TFT has the advantages of high mobility and rapid charging, and the other TFT has the advantage of low leakage current. For instance, the TFT structure will usually be arranged in an organic light-emitting diode (OLED) display panel. The TFT structure includes a first TFT and a second TFT. The first TFT is a low-temperature polysilicon thin-film transistor (LTPS-TFT), and the second TFT is a metal oxide TFT. When the display device provided with the OLED display panel displays an image, OLED elements in the OLED display panel are driven by utilization of the advantages of high mobility and rapid charging of the first TFT and the low leakage current of the second TFT, so that the display device can have good image display quality.

However, when both the first TFT having the advantages of high mobility and rapid charging and the second TFT having low leakage current are simultaneously arranged in the display panel, an active layer of the first TFT is usually doped with hydrogen (e.g., the low-temperature polysilicon thin-film transistor); the second TFT is usually a metal oxide TFT, namely a material of an active layer of the second TFT is metal oxide; and the metal oxide as the active layer of the second TFT is very sensitive to hydrogen. Therefore, when the both the first TFT having the advantages of high mobility and rapid charging and the second TFT having low leakage current are simultaneously arranged in the display panel, the hydrogen in the active layer of the first TFT may be diffused into the active layer of the second TFT and causes adverse effects on the active layer of the second TFT, and then adversely affects the performances of the second TFT.

SUMMARY

At least one embodiment of the present disclosure provides a thin-film transistor structure, which can prevent hydrogen in an active layer of a first TFT from being diffused into an active layer of a second TFT and adversely affect the performances of the second TFT.

At a first aspect, an embodiment of the present disclosure provides a thin-film transistor structure, the thin-film transistor structure comprises: a base substrate; and a first thin-film transistor and a second thin-film transistor, formed on the base substrate, wherein a first active layer of the first thin-film transistor is doped with hydrogen; a material of a second active layer of the second thin-film transistor is metal oxide; and a first isolation barrier surrounding the first thin-film transistor and/or a second isolation barrier surrounding the second thin-film transistor are disposed on the base substrate.

Exemplarily, a second gate insulating layer of the second thin-film transistor covers the first thin-film transistor; a first through hole surrounding the second thin-film transistor is disposed in the second gate insulating layer; and the second isolation barrier is filled into the first through hole.

Exemplarily, the second isolation barrier includes a first portion and a second portion; the first portion is disposed on the base substrate and covers an edge and a side surface of a first insulating layer of the first thin-film transistor surrounding the second thin-film transistor; and a second gate insulating layer of the second thin-film transistor covers the first thin-film transistor and the first portion; a region of the second gate insulating layer corresponding to the first portion is provided with a second through hole surrounding the second thin-film transistor; the second portion is filled into the second through hole; and the second portion is in contact with the first portion.

Exemplarily, the first isolation barrier includes a third portion and a fourth portion, in which the third portion is disposed on the base substrate and covers an edge and a side surface of a first insulating layer of the first thin-film transistor, being disposed on the base substrate and formed in a region of the first thin-film transistor and surrounding the first thin-film transistor on the base substrate; a second gate insulating layer of the second thin-film transistor covers the first thin-film transistor and the third portion; a region of the second gate insulating layer corresponding to the third portion is provided with a third through hole surrounding the first thin-film transistor; the fourth portion is filled into the third through hole; and the fourth portion is in contact with the third portion.

Exemplarily, the first thin-film transistor is a low temperature polysilicon thin-film transistor; and the second thin-film transistor is a bottom-gate thin-film transistor.

Exemplarily, the first thin-film transistor includes a connecting electrode disposed on the second gate insulating layer; the connecting electrode is connected with a drain electrode of first source/drain electrodes in the first thin-film transistor through a first connecting hole in the second gate insulating layer; or, the connecting electrode is connected with a source electrode of the first source/drain electrodes in the first thin-film transistor through a second connecting hole in the second gate insulating layer.

Exemplarily, the first isolation barrier is an organic material isolation barrier, an inorganic material isolation barrier or a metal isolation barrier; and the second isolation barrier is an organic material isolation barrier, an inorganic material isolation barrier or a metal isolation barrier.

Exemplarily, the first insulating layer includes the first gate insulating layer of the first thin-film transistor and a first interlayer insulating layer covering the first gate electrode of the first thin-film transistor.

Exemplarily, the third portion covering the edge and the side surface of the first insulating layer of the first thin-film transistor, being disposed on the base substrate and formed in a region of the first thin-film transistor and surrounding the first thin-film transistor, includes: the third portion covering a side surface of the first gate insulating layer of the first thin-film transistor, being disposed on the base substrate and formed in the region of the first thin-film transistor and surrounding the first thin-film transistor, and the third portion covering an edge and a side surface of the first interlayer insulating layer of the first thin-film transistor, being disposed on the base substrate and formed in the region of the first thin-film transistor and surrounding the first thin-film transistor.

At a second aspect, an embodiment of the present disclosure provides a display panel, the display panel comprises the thin-film transistor structure according to any one of the first aspect.

At a third aspect, an embodiment of the present disclosure provides a display device, the display device comprises the display panel according to any one of the second aspect.

At a fourth aspect, an embodiment of the present disclosure provides a method for manufacturing the thin-film transistor structure, comprising: forming a first thin-film transistor, a second thin-film transistor and a first isolation barrier and/or a second isolation barrier on a base substrate, in which a first active layer of the first thin-film transistor is doped with hydrogen; a material of a second active layer of the second thin-film transistor is metal oxide; the first isolation barrier surrounds the first thin-film transistor; and the second isolation barrier surrounds the second thin-film transistor.

Exemplarily, the first thin-film transistor is a low temperature polysilicon thin-film transistor; and the second thin-film transistor is a bottom-gate thin-film transistor; and the forming the first thin-film transistor, the second thin-film transistor and the second isolation barrier on the base substrate includes: forming the first thin-film transistor on the base substrate; and forming the second thin-film transistor and the second isolation barrier surrounding the second thin-film transistor on the base substrate.

Exemplarily, the forming the first thin-film transistor on the base substrate includes: forming a first active layer of the first thin-film transistor; forming a first gate insulating layer of the first thin-film transistor; forming a first gate electrode of the first thin-film transistor; forming a first interlayer insulating layer of the first thin-film transistor; forming an exposed hole, a first connecting hole and a second connecting hole running through the first interlayer insulating layer and the first gate insulating layer, in which the exposed hole exposes a region on the base substrate in which the second thin-film transistor is disposed; the first active layer is exposed by both the first connecting hole and the second connecting hole; and forming first source/drain electrodes of the first thin-film transistor and a second gate electrode of the second thin-film transistor, in which the first source/drain electrodes include a first source electrode and a first drain electrode; the first source electrode is connected with the first active layer through the first connecting hole; the first drain electrode is connected with the first active layer through the second connecting hole; the second gate electrode is disposed on the base substrate and in the exposed hole; and the forming the second thin-film transistor and the second isolation barrier surrounding the second thin-film transistor on the base substrate includes: forming a second gate insulating layer of the second thin-film transistor; forming a second active layer of the second thin-film transistor; forming a first through hole surrounding the second thin-film transistor and exposing the base substrate, a third connecting hole corresponding to the first source electrode of the first thin-film transistor, or a fourth connecting hole corresponding to the first drain electrode of the first thin-film transistor in the second gate insulating layer; and forming second source/drain electrodes of the second thin-film transistor, the second isolation barrier filled into the first through hole, and a connecting electrode which is connected with the first source electrode through the third connecting hole or connected with the first drain electrode through the fourth connecting hole.

Exemplarily, the first thin-film transistor is a low temperature polysilicon thin-film transistor; and the second thin-film transistor is a bottom-gate thin-film transistor; and the forming the first thin-film transistor, the second thin-film transistor and the second isolation barrier on the base substrate includes: forming the first thin-film transistor and a first portion of the second isolation barrier on the base substrate, in which the first portion covers an edge and a side surface of the first insulating layer of the first thin-film transistor surrounding the second thin-film transistor; and forming the second thin-film transistor and a second portion of the second isolation barrier on the base substrate, in which the second portion is disposed on the first portion, and the first portion and the second portion surround the second thin-film transistor together.

Exemplarily, the forming the thin-film transistor and the first portion of the second isolation barrier on the base substrate includes: forming a first active layer of the first thin-film transistor; forming a first gate insulating layer of the first thin-film transistor; forming a first gate electrode of the first thin-film transistor; forming a first interlayer insulating layer of the first thin-film transistor; forming an exposed hole, a first connecting hole and a second connecting hole running through the first interlayer insulating layer and the first gate insulating layer, in which the exposed hole exposes a region on the base substrate in which the second thin-film transistor is disposed, and the first active layer is exposed by both the first connecting hole and the second connecting hole; and forming first source/drain electrodes of the first thin-film transistor, a second gate electrode of the second thin-film transistor and the first portion of the second isolation barrier, in which the first source/drain electrodes include a first source electrode and a first drain electrode; the first source electrode is connected with the first active layer through the first connecting hole; the first drain electrode is connected with the first active layer through the second connecting hole; the first portion covers an edge and a wall of the exposed hole; the second gate electrode is disposed on the base substrate and in the exposed hole; and the forming the second thin-film transistor and the second portion of the second isolation barrier on the base substrate includes: forming a second gate insulating layer of the second thin-film transistor; forming a second active layer of the second thin-film transistor; forming a second through hole surrounding the second thin-film transistor and corresponding to the first portion, a third connecting hole corresponding to the first source electrode of the first thin-film transistor, or a fourth connecting hole corresponding to the first drain electrode of the first thin-film transistor in the second gate insulating layer; and forming second source/drain electrodes of the second thin-film transistor, the second portion being filled into the second through hole and being in contact with the first portion, and a connecting electrode which is connected with the first source electrode through the third connecting hole or connected with the first drain electrode through the fourth connecting hole.

Exemplarily, the first thin-film transistor is a low temperature polysilicon thin-film transistor; and the second thin-film transistor is a bottom-gate thin-film transistor; and the forming the first thin-film transistor, the second thin-film transistor and the first isolation barrier on the base substrate includes: forming the first thin-film transistor and a third portion of the first isolation barrier on the base substrate, in which the third portion covers an edge and a side surface of the first insulating layer of the first thin-film transistor surrounding the first thin-film transistor; and forming the second thin-film transistor and a fourth portion of the first isolation barrier on the base substrate, in which the fourth portion is disposed on the third portion, and the third portion and the fourth portion surround the first thin-film transistor together.

Exemplarily, the forming the first thin-film transistor and the third portion of the isolation barrier on the base substrate includes: forming a first active layer of the first thin-film transistor; forming a first gate insulating layer of the first thin-film transistor; forming a first gate electrode of the first thin-film transistor; forming a first interlayer insulating layer of the first thin-film transistor; removing a portion of the first gate insulating layer and the first interlayer insulating layer disposed outside a region of the base substrate in which the first thin-film transistor is disposed, and forming a first connecting hole and a second connecting hole running through the first interlayer insulating layer and the first gate insulating layer, in which side surfaces of the first gate insulating layer and the first interlayer insulating layer are disposed in the region of the base substrate in which the first thin-film transistor is disposed; the first active layer is exposed by both the first connecting hole and the second connecting hole; and forming first source/drain electrodes of the first thin-film transistor, the second gate electrode of the second thin-film transistor and the third portion of the first isolation barrier, in which the first source/drain electrodes include a first source electrode and a first drain electrode; the first source electrode is connected with the first active layer through the first connecting hole; the first drain electrode is connected with the first active layer through the second connecting hole; the third portion covers an edge and the side surface of the first interlayer insulating layer and the side surface of the first gate insulating layer; the second gate electrode is disposed on the base substrate; and the forming the second thin-film transistor and the fourth portion of the first isolation barrier on the base substrate includes: forming a second gate insulating layer of the second thin-film transistor; forming a second active layer of the second thin-film transistor; forming a third through hole surrounding the first thin-film transistor and corresponding to the third portion, a third connecting hole corresponding to the first source electrode of the first thin-film transistor, or a fourth connecting hole corresponding to the first drain electrode of the first thin-film transistor in the second gate insulating layer; and forming second source/drain electrodes of the thin-film transistor, the fourth portion being filled in the third through hole and being in contact with the third portion, and a connecting electrode which is connected with the first source electrode through the third connecting hole or connected with the first drain electrode through the fourth connecting hole.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 3 is a schematic view of still another thin-film transistor provided by an embodiment of the present disclosure;

FIG. 4 is a flow chart of a manufacturing method of a thin-film transistor provided by an embodiment of the present disclosure;

FIG. 5 is a flow chart of exemplary method of a manufacturing method of a thin-film transistor shown in FIG. 4;

Figure 1:
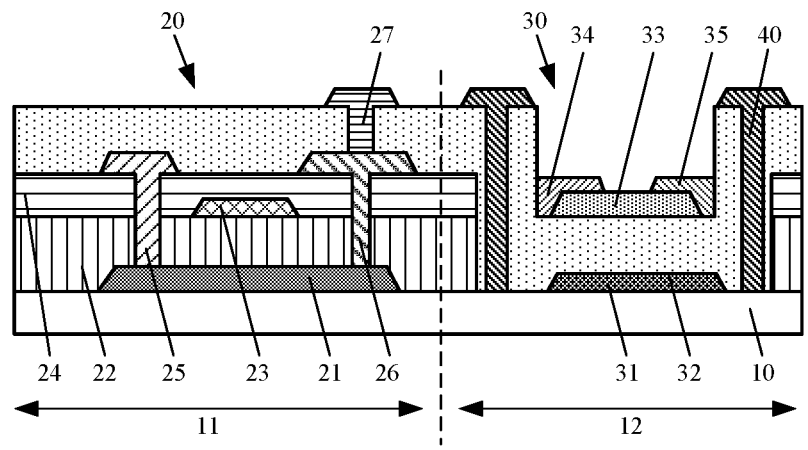
FIG. 1 is a schematic view of a thin-film transistor provided by an embodiment of the present disclosure.

| Reference numbers: | | |
|---|---|---|
| 10-base substrate, | 11-first region, | 12-second region, |
| 20-first TFT | 21-first active layer, | 22-first gate insulating layer, |
| 23-first gate electrode, | 24-first interlayer insulating layer, | |
| 241-exposing hole, | 242-first connecting hole, | |
| 243-second connecting hole, | | 25-first source electrode, |
| 26-first drain electrode, | 27-connecting electrode, | |
| 30-second TFT, | 31-second gate electrode, | |
| 32-second gate insulting layer, | | 321-first through hole |
| 322-second through hole, | | 323-third through hole, |
| 324-fourth connecting hole, | | 33-second active layer, |
| 34-second source electrode, | | 35-second drain electrode, |
| 40-second isolation barrier, | 41-first portion, | 42-second portion, |
| 50-first isolation barrier, | 51-third portion, | 52-fourth portion. |

DETAILED DESCRIPTION

Embodiments of the present disclosure will be in detail described hereinafter, and examples of the embodiments are shown in the drawings, in which the same or similar reference number is denoted as the same or similar members or the members with the same or similar function throughout. The described embodiments in conjunction with the accompanying drawings of the present disclosure are exemplary, only is used to explain the present disclosure and do not intend to limit the present disclosure.

In the description, the description with referring to the terms "an embodiment", "some embodiments", "example", "specific example" or "some examples" means that the specific feature, structure, material or character described with connection with the embodiment or example is included in at least one embodiment or example of the present disclosure. In the description, the schematic description of the above terms is not necessary to direct to the same embodiment or example. The described feature, structure, material or character may be combined in any suitable manner in any or a plurality of embodiments or examples. Further, in case of no conflict, different embodiments or examples and features in different embodiments or example described in the specification can be combined.

Further, the terms, such as "first," "second," or the like, which are used in the description and the claims of the present disclosure, are not intended to indicate or imply the relative importance or implicitly indicate the amount of the features. Thus, the features defined by "first," "second," may explicitly indicate or implicitly includes at least one feature. In the description of the present disclosure, Unless otherwise defined, "a plurality of" means two or more. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," or the like are only used to indicate relative position relationship, and when the position of the object which is described is changed, the relative position relationship may be changed accordingly.

Detailed description will be given below to the TFT structure, the manufacturing method thereof, the display panel and the display device, provided by an embodiment of the present disclosure, with reference to the accompanying drawings.

Figure 2:
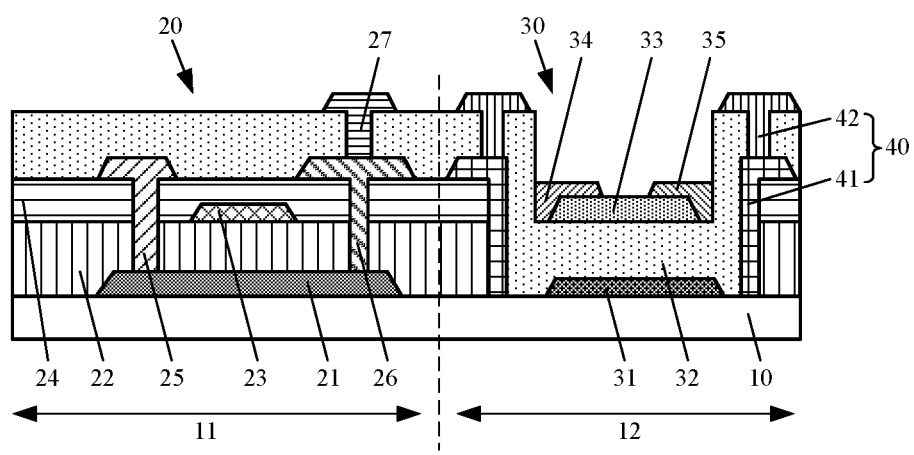
FIG. 2 is a schematic view of another thin-film transistor provided by an embodiment of the present disclosure.

As shown in FIGS. 1-3, the TFT structure provided by an embodiment of the present disclosure comprises a base substrate 10 and a first TFT 20 and a second TFT 30 formed on the base substrate 10, wherein a first active layer 21 of the first TFT 20 is doped with hydrogen; a material of a second active layer 33 of the second TFT 30 is metal oxide; the base substrate 10 is also provided with a first isolation barrier 50 at least surrounding the first active layer 21 of the first TFT 20 and/or a second isolation barrier 40 surrounding the second active layer 33 of the second TFT 30; and the first isolation barrier 50 and the second isolation barrier 40 are disposed between the first active layer 21 and the second active layer 33 in a direction parallel to the base substrate 10, so as to prevent hydrogen in the active layer of the first TFT from being diffused into the active layer of the second TFT and adversely affect the performances of the second TFT.

Exemplarily, in order to better prevent the diffusion of the hydrogen in the active layer of the first TFT, the first isolation barrier and the second isolation barrier respectively surround the first TFT and the second TFT and isolate the first TFT and the second TFT in the direction parallel to the base substrate. The first isolation barrier 50 and the second isolation barrier 40 are disposed between the first and second TFTs in the direction parallel to the base substrate.

For example, with reference to FIG. 1 or 2, the TFT structure provided by the embodiment of the present disclosure comprises a base substrate 10, a first TFT 20 and a second TFT 30; the first base substrate 10 comprises a first region 11 and a second region 12; the first TFT 20 is formed in the first region 11 on the base substrate 10; the second TFT 30 is formed in the second region 12 on the base substrate 10; the first TFT 20 includes a first active layer 21 which is doped with hydrogen; for instance, the first TFT 20 may be an amorphous silicon (a-Si) TFT, a monocrystalline silicon (mono-Si) TFT, a polycrystalline silicon (poly-Si) TFT (e.g., an LTPS-TFT), etc.; the second TFT 30 is a metal oxide TFT, namely material of the second active layer 33 of the second TFT 30 is metal oxide; and for instance, the material of the second active layer 33 of the second TFT 30 may be indium gallium zinc oxide (IGZO).

The base substrate 10 is also provided with a first isolation barrier 50 and/or a second isolation barrier 40. For instance, as shown in FIG. 1 or 2, the base substrate 10 is provided with the second isolation barrier 40; the second isolation barrier 40 surrounds the second TFT 30; and the second isolation barrier 40 may be disposed at an edge of the second region 12 on the base substrate 10 or in the second region 12, so as to surround the second TFT 30 in the second region 12 on the base substrate 10 and isolate the second TFT 30 and the first TFT 20. Or, as shown in FIG. 3, the base substrate 10 is provided with the first isolation barrier 50; the first isolation barrier 50 surrounds the first TFT 20; and the first isolation barrier 50 may be disposed at an edge of the first region 11 on the base substrate 10 or in the first region 11, so as to surround the first TFT 20 in the first region 11 on the base substrate 10 and isolate the second TFT 30 and the first TFT 20. Or, in actual application, the base substrate 10 may be simultaneously provided with the first isolation barrier 50 and the second isolation barrier 40; the first isolation barrier 50 surrounds the first TFT 20, so as to surround the first TFT 20 in the first region 11 on the base substrate 10; the second isolation barrier 40 surrounds the second TFT 30, so as to surround the second TFT 30 in the second region 12 on the base substrate 10; and the first isolation barrier 50 and the second isolation barrier 40 cooperate with each other to isolate the second TFT 30 and the first TFT 20.

As can be seen from above, in the TFT structure provided by the embodiment of the present disclosure, the base substrate 10 is provided with the second isolation barrier 40 surrounding the second TFT 30 and/or the first isolation barrier 50 surrounding the first TFT 20; and the second isolation barrier 40 surrounds the second TFT 30 in a region on the base substrate 10 where the second TFT 30 is disposed, and the first isolation barrier 50 surrounds the first TFT 20 in a region on the base substrate 10 where the first TFT 20 is disposed, so as to isolate the second TFT 30 and the first TFT 20. Therefore, the arrangement of the second isolation barrier 40 and/or the first isolation barrier 50 can isolate the hydrogen in the first active layer 21 of the first TFT 20, can prevent the hydrogen in the first active layer 21 of the first TFT 20 from being diffused into the second TFT 30, for instance, preventing the hydrogen in the first active layer 21 of the first TFT 20 from being diffused into the second active layer 33 of the second TFT 30, and then can avoid the adverse effects caused by the hydrogen in the first active layer 21 of the first TFT 20 on the second TFT 30, for instance, avoiding the adverse effects caused by the hydrogen in the first active layer 21 of the first TFT 20 on the second active layer 33 of the second TFT 30, and finally, can avoid the adverse effects caused by the hydrogen in the first active layer 21 of the first TFT 20 on the performances of the second TFT 30.

In addition, in the TFT structure provided by the embodiment of the present disclosure, the base substrate 10 is provided with the second isolation barrier 40 surrounding the second TFT 30 and/or the first isolation barrier 50 surrounding the first TFT 20; and the second isolation barrier 40 surrounds the second TFT 30 in the region on the base substrate 10 where the second TFT 30 is disposed, and the first isolation barrier 50 surrounds the first TFT 20 in the region on the base substrate 10 where the first TFT 20 is disposed, so as to isolate the second TFT 30 and the first TFT 20. Therefore, in the process of manufacturing the TFT structure provided by the embodiment of the present disclosure, the process window for manufacturing the second TFT 30 can be widened, and the manufacturing difficulty of the TFT structure can be reduced.

Moreover, in the TFT structure provided by the embodiment of the present disclosure, by arrangement of the second isolation barrier 40 surrounding the second TFT 30 and/or the first isolation barrier 50 surrounding the first TFT 20 on the base substrate 10, the second isolation barrier 40 surrounds the second TFT 30 in the region on the base substrate 10 where the second TFT 30 is disposed, and the first isolation barrier 50 surrounds the first TFT 20 in the region on the base substrate 10 where the first TFT 20 is disposed, so as to isolate the second TFT 30 and the first TFT 20, thereby preventing the hydrogen in the first active layer 21 of the first TFT 20 from adversely affecting the performances of the second TFT 30 and improving the characteristics and the stability of the second TFT 30. Therefore, the image display quality of the display device employing the TFT structure provided by the embodiment of the present disclosure can be improved.

In the above embodiment, the base substrate 10 may be only provided with the first isolation barrier 50, or the base substrate 10 may be only provided with the second isolation barrier 40, or the base substrate 10 may be simultaneously provided with the first isolation barrier 50 and the second isolation barrier 40, wherein the setting form of the second isolation barrier 40 may be set according to actual demands. For instance, as shown in FIG. 1, a second gate insulating layer 32 of the second TFT 30 covers the first TFT 20; the second gate insulating layer 32 is provided with a first through hole surrounding the second TFT 30; and the second isolation barrier 40 is filled in the first through hole. Exemplarily, with reference to FIG. 1, the first TFT 20 is disposed in the first region 11 on the base substrate 10; the second TFT 30 is disposed in the second region 12 on the base substrate 10; the second TFT 30 includes the second gate insulating layer 32 which covers the first TFT 20; the second gate insulating layer 32 is provided with the first through hole surrounding the second TFT 30, that is, the first through hole is annular and may be formed inside the second region 12 or at an edge of the second region 12; the second isolation barrier 40 is taken as an integral structure and filled in the first through hole; and the second isolation barrier 40 makes contact with the base substrate 10, so as to surround the second TFT 30 and then isolate the second TFT 30 and the first TFT 20.

In actual application, the second isolation barrier 40 may also be divided into a plurality of portions. For instance, as shown in FIG. 2, the second isolation barrier 40 may include a first portion 41 and a second portion 42, wherein the first portion 41 is disposed on the base substrate 10 and covers an edge and a side surface of a first insulating layer of the first TFT 20 surrounding the second TFT 30; the second gate insulating layer 32 of the second TFT 30 covers the first TFT 20 and the first portion 41; a region of the second gate insulating layer 32 corresponding to the first portion 41 is provided with a second through hole surrounding the second TFT 30; and the second portion 42 fills in the second through hole and makes contact with the first portion 41.

For example, with reference to FIG. 2, a region of the first insulating layer of the first TFT 20, corresponding to the second region 12 on the base substrate 10 provided with the second TFT 30, is provided with an exposed hole; the base substrate 10 is exposed through the exposed hole; the second TFT 30 is disposed in the exposed hole on the base substrate 10; the first portion 41 of the second isolation barrier 40 is disposed on the base substrate 10; and the first portion 41 covers an edge and a wall of the exposed hole, namely the first portion 41 covers the edge and the side surface of the first insulating layer surrounding the second TFT 30. Wherein when the first TFT 20 is a bottom-gate TFT or a top-gate TFT, the first TFT 20 includes a first gate insulating layer disposed between the first gate electrode and the first active layer of the first TFT 20, and at this point, the first insulating layer may include the first gate insulating layer of the first TFT 20; or as shown in FIG. 2, when the first TFT 20 is an LTPS-TFT, the first TFT 20 includes a first gate insulating layer 22 disposed between a first active layer 21 and a first gate electrode 23 of the first TFT 20, and a first interlayer insulating layer 24 disposed between the first gate electrode 23 and first source/drain electrodes (including a first source electrode 25 and a first drain electrode 26) of the first TFT 20, and at this point, the first insulating layer may include the first gate insulating layer 22 and the first interlayer insulating layer 24 of the first TFT 20.

The second TFT 30 includes a second gate insulating layer 32; the second gate insulating layer 32 covers the first TFT 20 and the first portion 41; a region of the second gate insulating layer 32 corresponding to the first portion 41 is provided with a second through hole surrounding the second TFT 30; the second through hole is annular; the second portion 42 of the second isolation barrier 40 is filled in the second through hole and makes contact with the first portion 41; and the first portion 41 and the second portion 42 form the second isolation barrier 40 of the second TFT 30 together, surround the second TFT 30, and isolate the second TFT 30 and the first TFT 20.

The second isolation barrier 40 is set to include the first portion 41 and the second portion 42. The first portion 41 is disposed on the base substrate 10. The first portion 41 covers the edge and the side surface of the first insulating layer of the first TFT 20 surrounding the second TFT 30, so the first portion 41 can isolate the first insulating layer of the first TFT 20 and the second TFT 30 and prevent possible hydrogen in the first insulating layer of the first TFT 20 from being diffused into the second TFT 30. For instance, when the first TFT 20 is an LTPS-TFT, the first insulating layer includes the first gate insulating layer 22 and the first interlayer insulating layer 24; the first portion 41 of the second isolation barrier 40 can isolate both the first gate insulating layer 22 and the first interlayer insulating layer 24 from the second TFT 30 and prevent possible hydrogen in the first gate insulating layer 22 and the first interlayer insulating layer 24 from being diffused into the second TFT 30.

In the above embodiment, the setting form of the first isolation barrier 50 may be set according to actual demands. For instance, as shown in FIG. 3, the first isolation barrier 50 includes a third portion 51 and a fourth portion 52, wherein the third portion 51 is disposed on the base substrate 10 and covers an edge and a side surface of the first insulating layer of the first TFT 20, being disposed in an region on the base substrate 10 in which the first TFT 20 is disposed and surrounding the first TFT 20; the second gate insulating layer 32 of the second TFT 30 covers the first TFT 20 and the third portion 51; a region of the second gate insulating layer 32 corresponding to the third portion 51 is provided with a third through hole surrounding the first TFT 20; the fourth portion 52 is filled into the third through hole; and the fourth portion 52 makes contact with the third portion 51.

For example, as shown in FIG. 3, the first insulating layer of the first TFT 20 is all disposed in the first region 11 on the base substrate 10 in which the first TFT 20 is disposed, and a side surface of the first insulating layer is disposed in the first region 11. It should be noted that the description that the side surface of the first insulating layer is disposed in the first region 11 herein may be understood as that the side surface of the first insulating layer is disposed at an edge or inside of the first region 11; the side surface of the first insulating layer surrounds the first TFT 20; the third portion 51 of the first isolation barrier 50 is disposed on the base substrate 10; and the third portion 51 covers the edge and the side surface of the first insulating layer, namely the third portion 51 surrounds the first TFT 20. Wherein, when the first TFT 20 is a bottom-gate TFT or a top-gate TFT, the first TFT 20 includes a first gate insulating layer disposed between the first gate electrode and the first active layer of the first TFT, and at this point, the first insulating layer may include the first gate insulating layer of the first TFT 20; or as shown in FIG. 3, when the first TFT 20 is an LTPS-TFT, the first TFT 20 includes a first gate insulating layer 22 disposed between the first active layer 21 and the first gate electrode 23 of the first TFT 20, and a first interlayer insulating layer 24 disposed between the first gate electrode 23 and the first source/drain electrodes (including the first source electrode 25 and the first drain electrode 26) of the first TFT 20, and at this point, the first insulating layer may include the first gate insulating layer 22 and the first interlayer insulating layer 24 of the first TFT 20.

The second TFT 30 includes a second gate insulating layer 32; the second gate insulating layer 32 covers the first TFT 20 and the third portion 51; a region of the second gate insulating layer 32 corresponding to the third portion 51 is provided with a third through hole surrounding the first TFT 30; the third through hole is annular; the fourth portion 52 of the first isolation barrier 50 is filled in the third through hole and makes contact with the third portion 51; and the third portion 51 and the fourth portion 52 form the first isolation barrier 50 of the first TFT 20 together, surround the first TFT 20, and isolate the first TFT 20 and the second TFT 30.

The first isolation barrier 50 is set to include the third portion 51 and the fourth portion 52. The third portion 51 is disposed on the base substrate 10. The third portion 51 covers an edge and a side surface of the first insulating layer of the first TFT 20, being disposed in the first region 11 and surrounding the first TFT 20, so the third portion 51 can isolate the first insulating layer of the first TFT 20 and the second TFT 30 and prevent possible hydrogen in the first insulating layer of the first TFT 20 from being diffused into the second TFT 30. For instance, when the first TFT 20 is an LTPS-TFT, the first insulating layer includes the first gate insulating layer 22 and the first interlayer insulating layer 24, and the third portion 51 of the first isolation barrier 50 can isolate both the first gate insulating layer 22 and the first interlayer insulating layer 24 from the second TFT 30 and prevent possible hydrogen in the first gate insulating layer 22 and the first interlayer insulating layer 24 from being diffused into the second TFT 30.

In the above embodiment, when the base substrate 10 is simultaneously provided with the first isolation barrier 50 and the second isolation barrier 40, the first isolation barrier 50 may be set in the form of including the third portion 51 and the fourth portion 52, and the second isolation barrier 40 may be set in the integral form, namely the second isolation barrier 40 is set in the form of being filled in the first through hole that is formed in the second gate insulating layer 32 and surrounds the second TFT 30. That is to say, the first isolation barrier 50 may be set in the form as shown in FIG. 3, and the second isolation barrier 40 may be set in the form as shown in FIG. 1.

In the above embodiment, a type of the first TFT 20 may be selected according to actual demands. For instance, the first TFT 20 may be an amorphous silicon TFT, a monocrystalline silicon TFT, a polycrystalline silicon TFT, etc. In the embodiment of the present disclosure, the first TFT 20 is an LTPS-TFT. As shown in FIG. 1 or 2, the first TFT 20 includes a first active layer 21, a first gate insulating layer 22, a first gate electrode 23, a first interlayer insulating layer 24 and first source/drain electrodes, wherein the first active layer 21 is disposed on the base substrate 10; the first gate insulating layer 22 covers the base substrate 10 and the first active layer 21; a region of the first gate insulating layer 22, corresponding to a region on the base substrate 10 where the second TFT 30 is disposed, is provided with a first exposed hole through which the base substrate 10 is exposed; the first gate electrode 23 is disposed on the first gate insulating layer 22 and above the first active layer 21; the first interlayer insulating layer 24 covers the first gate electrode 23 and the first gate insulating layer 22; a region of the first interlayer insulating layer 24, corresponding to the first exposed hole in the first gate insulating layer 22, is provided with a second exposed hole through which the base substrate 10 is exposed; a first connecting hole and a second connecting hole, running through the first interlayer insulating layer 24 and the first gate insulating layer 22, are also formed on the first active layer 21, and both the first connecting hole and the second connecting hole expose the first active layer 21; the first source/drain electrodes are disposed on the first interlayer insulating layer 24 and include a first source electrode 25 and a first drain electrode 26; the first source electrode 25 is connected with the first active layer 21 through the first connecting hole; and the first drain electrode 26 is connected with the first active layer 21 through the second connecting hole. Or, as shown in FIG. 3, the first TFT 20 includes a first active layer 21, a first gate insulating layer 22, a first gate electrode 23, a first interlayer insulating layer 24 and first source/drain electrodes, wherein the first active layer 21 is disposed in the first region 11 on the base substrate 10; the first gate insulating layer 22 covers the first active layer 21 and the base substrate 10 disposed in the first region 11; the first gate electrode 23 is disposed on the first gate insulating layer 22 and above the first active layer 21; the first interlayer insulating layer 24 covers the first gate electrode 23 and the first gate insulating layer 22; a first connecting hole and a second connecting hole, running through the first interlayer insulating layer 24 and the first gate insulating layer 22, are also formed on the first active layer 21; both the first connecting hole and the second connecting hole expose the first active layer 21; the first source/drain electrodes are disposed on the first interlayer insulating layer 24 and include a first source electrode 25 and a first drain electrode 26; the first source electrode 25 is connected with the first active layer 21 through the first connecting hole; and the first drain electrode 26 is connected with the first active layer 21 through the second connecting hole.

In the above embodiment, a type of the second TFT 30 may be selected according to actual demands. For instance, the second TFT 30 may be a bottom-gate TFT, a top-gate TFT, etc. In the embodiment of the present disclosure, as shown in FIG. 1 or 2, the second TFT 30 is a bottom-gate TFT and includes a second gate electrode 31, a second gate insulating layer 32, a second active layer 33 and second source/drain electrodes, wherein the second gate electrode 31 is disposed on the base substrate 10; the second gate insulating layer 32 covers the second gate electrode 31, the base substrate 10 and the first TFT 20; the second active layer 33 is disposed on the second gate insulating layer 32 and above the second gate electrode 31; a material of the second active layer 33 may be IGZO; the second source/drain electrodes are disposed on the second active layer 33 and include a second source electrode 34 and a second drain electrode 35; and the second source electrode 34 and the second drain electrode 35 respectively make contact with the second active layer 33.

Exemplarily, the second TFT 30 may be formed in the first exposed hole and the second exposed hole.

As shown in FIG. 1, the first TFT 20 is an LTPS-TFT; the second TFT 30 is a bottom-gate TFT; a first through hole surrounding the second TFT 30 is formed in the second gate insulating layer 32; the base substrate 10 is exposed through the first through hole; the second isolation barrier 40 is filled in the first through hole, so as to isolate the second TFT 30 and the first TFT 20; the first TFT 20 further includes a connecting electrode 27; a region of the second gate insulating layer 32 corresponding to the first source electrode 25 is provided with a third connecting hole, and at this point, the connecting electrode 27 is connected with the first source electrode 25 through the third connecting hole; or a region of the second gate insulating layer 32 corresponding to the first drain electrode 26 is provided with a fourth connecting hole, and at this point, the connecting electrode 27 is connected with the first drain electrode 26 through the fourth connecting hole, so as to facilitate the connection between the first source electrode 25 or the first drain electrode 26 of the first TFT 20 and other structures.

As shown in FIG. 2, the first TFT 20 is an LTPS-TFT; the second TFT 30 is a bottom-gate TFT; the second isolation barrier 40 includes a first portion 41 and a second portion 42; the first portion 41 covers the edge and the side surface of the first interlayer insulating layer 24 of the first TFT 20 surrounding the second TFT 30, and the side surface of the first gate insulating layer 22 of the first TFT 20 surrounding the second TFT 30; a region of the second gate insulating layer 32 corresponding to the first portion 41 is provided with a second through hole; the second through hole surrounds the second TFT 30; the second portion 42 of the second isolation barrier 40 is filled in the second through hole and makes contact with the first portion 41; and the first portion 41 and the second portion 42 surround the second TFT 30 together, so as to isolate the second TFT 30 and the first TFT 20. Similarly, the first TFT 20 further includes a connecting electrode 27; a region of the second gate insulating layer 32 corresponding to the first source electrode 25 is provided with a third connecting hole, and at this point, the connecting electrode 27 is connected with the first source electrode 25 through the third connecting hole; or a region of the second gate insulating layer 32 corresponding to the first drain electrode 26 is provided with a fourth connecting hole, and at this point, the connecting electrode 27 is connected with the first drain electrode 26 through the fourth connecting hole, so as to facilitate the connection between the first source electrode 25 or the first drain electrode 26 of the first TFT 20 and other structures.

As shown in FIG. 3, the first TFT 20 is an LTPS-TFT; the second TFT 30 is a bottom-gate TFT; the first isolation barrier 50 includes a third portion 51 and a fourth portion 52; the third portion 51 covers the edge and the side surface of the first interlayer insulating layer 24 of the first TFT 20, being disposed in the first region 11 and surrounding the first TFT 20, and the side surface of the first gate insulating layer 22 of the first TFT 20 surrounding the first TFT 20; a region of the second gate insulating layer 32 corresponding to the third portion 51 is provided with a third through hole; the third through hole surrounds the first TFT 20; the fourth portion 52 of the first isolation barrier 50 is filled in the third through hole and makes contact with the third portion 51; and the third portion 51 and the fourth portion 52 surround the first TFT 20 together, so as to isolate the first TFT 20 and the second TFT 30. Similarly, the first TFT 20 further includes a connecting electrode 27; a region of the second gate insulating layer 32 corresponding to the first source electrode 25 is provided with a third connecting hole, and at this point, the connecting electrode 27 is connected with the first source electrode 25 through the third connecting hole; or a region of the second gate insulating layer 32 corresponding to the first drain electrode 26 is provided with a fourth connecting hole, and at this point, the connecting electrode 27 is connected with the first drain electrode 26 through the fourth connecting hole, so as to facilitate the connection between the first source electrode 25 or the first drain electrode 26 of the first TFT 20 and other structures.

In the embodiment of the present disclosure, as shown in FIGS. 1 to 3, the first TFT 20 is an LTPS-TFT; the second TFT 30 is a bottom-gate TFT; and the second gate insulating layer 32 of the second TFT 30 covers the first TFT 20. Thus, in the process of manufacturing the TFT structure provided by the embodiment of the present disclosure, the first TFT 20 may be formed on the base substrate 10 at first, and then the second TFT 30 is formed on the base substrate 10. In the process of forming the second TFT 30, the second gate insulating layer 32 is formed prior to the second active layer 33, namely the second gate insulating layer 32 is formed at first and completely covers the base substrate 10, the second gate electrode 31 and the first TFT 20, and then the second active layer 33 is formed. In the process of forming the second active layer 33, for instance, in the process of performing annealing on a metal oxide film layer for forming the second active layer 33, the second gate insulating layer 32 can prevent the hydrogen in the first active layer 21 in the first TFT 20 from being diffused into the second active layer 33, and then avoid the adverse effects on the performances of the second TFT 30.

In addition, the first TFT 20 is an LTPS-TFT; the second TFT 30 is a bottom-gate TFT; and the second gate insulating layer 32 of the second TFT 30 covers the first TFT 20. Therefore, in the process of manufacturing the TFT structure provided by the embodiment of the present disclosure, the first TFT 20 may be formed on the base substrate 10 at first, and then the second TFT 30 is formed on the base substrate 10. In the process of forming the second TFT 30, the second gate insulating layer 32 is formed prior to the second active layer 33, namely the second gate insulating layer is formed at first and completely covers the base substrate 10, the second gate electrode 31 and the first TFT 20, and then the second active layer 33 is formed, which can prevent the mutual interference between the process of forming the first active layer 21 of the first TFT 20 and the process of forming the second active layer 33 of the second TFT 30.

In the above embodiment, both a material of the first isolation barrier 50 and a material of the second isolation barrier 40 may be varied, and both the material of the first isolation barrier 50 and the material of the second isolation barrier 40 only need to have good hydrogen-blocking property.

For example, the material of the first isolation barrier 50 may be an organic material, namely the first isolation barrier 50 is an organic material first isolation barrier 50, and for instance, the organic material may be polyethylene (PE); or the material of the first isolation barrier 50 may be an inorganic material, namely the first isolation barrier 50 is an inorganic material first isolation barrier 50, and for instance, the inorganic material may be aluminum oxide ($Al_2O_3$), silicon nitride (SiNx), etc.; or, the material of the first isolation barrier 50 may be metal, namely the first isolation barrier 50 is a metal first isolation barrier 50. At this point, as shown in FIG. 3, the first isolation barrier 50 includes a third portion 51 and a fourth portion 52; the first TFT 20 is an LTPS-TFT; and the second TFT 30 is a bottom-gate TFT. In the process of manufacturing the TFT structure, the first TFT 20 is formed in the first region 11 on the base substrate 10 at first. In the process of forming the first source/drain electrodes, namely the first source electrode 25 and the first drain electrode 26, of the first TFT 20, the third portion 51 of the first isolation barrier 50 may be simultaneously formed, namely the third portion 51 of the first isolation barrier 50 and the first source/drain electrodes of the first TFT 20 are simultaneously formed; and it can also be understood that the third portion 51 of the first isolation barrier 50 and the first source/drain electrodes of the first TFT 20 are formed by one patterning process, and the material of the third portion 51 of the first isolation barrier 50 is the same with the material of the first source/drain electrodes of the first TFT 20. Subsequently, the second TFT 30 is formed in the second region 12 on the base substrate 10. Before the step of forming second source/drain electrodes, namely a second source electrode 34 and a second drain electrode 35, of the second TFT 30, a third through hole surrounding the first TFT 20 is formed in the second gate insulating layer 32 of the second TFT 30. In the process of forming the second source/drain electrodes, namely the second source electrode 34 and the second drain electrode 35, of the second TFT 30, the fourth portion 52 of the first isolation barrier 50 may be simultaneously formed, namely the fourth portion 52 of the first isolation barrier 50 and the second source/drain electrodes of the second TFT 30 are simultaneously formed; and it can be also understood that the fourth portion 52 of the first isolation barrier 50 and the second source/drain electrodes of the second TFT 30 are formed by one patterning process, and the material of the fourth portion 52 of the first isolation barrier 50 is the same with the material of the second source/drain electrodes of the second TFT 30.

Exemplarily, the material of the second isolation barrier 40 may be an organic material, namely the second isolation barrier 40 is an organic material second isolation barrier 40, and for instance, the organic material may be PE; or the material of the second isolation barrier 40 may be an inorganic material, namely the second isolation barrier 40 is an inorganic material second isolation barrier 40, and for instance, the inorganic material may be $Al_2O_3$, SiNx, etc.; or, the material of the second isolation barrier 40 may be metal, namely the second isolation barrier 40 is a metal second isolation barrier 40. At this point, as shown in FIG. 1, the structure of the second isolation barrier 40 is an integral structure; the first TFT 20 is an LTPS-TFT; and the second TFT 30 is a bottom-gate TFT. In the process of manufacturing the TFT structure, the first TFT 20 is formed in the first region 11 on the base substrate 10 at first, and then the second TFT 30 is formed in the second region 12 on the base substrate 10, wherein before a step of forming the second source/drain electrodes, namely the second source electrode 34 and the second drain electrode 35, of the second TFT 30, a first through hole surrounding the second TFT 30 is formed in the second gate insulating layer 32 of the second TFT 30. In the process of forming the second source/drain electrodes, namely the second source electrode 34 and the second drain electrode 35, of the second TFT 30, the second isolation barrier 40 may be simultaneously formed, namely the second isolation barrier 40 and the second source/drain electrodes of the second TFT 30 are simultaneously formed; and it may be also understood that the second isolation barrier 40 and the second source/drain electrodes of the second TFT 30 are formed by one patterning process, and the material of the second isolation barrier 40 is the same with the material of the second source/drain electrodes of the second TFT 30. As shown in FIG. 2, the structure of the second isolation barrier 40 includes a first portion 41 and a second portion 42; the first TFT 20 is an LTPS-TFT; and the second TFT 30 is a bottom-gate TFT. In the process of manufacturing the TFT structure, the first TFT 20 is formed in the first region 11 on the base substrate 10 at first. In the process of forming the first source/drain electrodes, namely the first source electrode 25 and the first drain electrode 26, of the first TFT 20, the first portion 41 of the second isolation barrier 40 may be simultaneously formed, namely the first portion 41 of the second isolation barrier 40 and the first source/drain electrodes of the first TFT 20 are simultaneously formed; and it may be also understood that the first portion 41 of the second isolation barrier 40 and the first source/drain electrodes of the first TFT 20 are formed by one patterning process, and the material of the first portion 41 of the second isolation barrier 40 is the same with the material of the first source/drain electrodes of the first TFT 20. Subsequently, the second TFT 30 is formed in the second region 12 on the base substrate 10. Before the step of forming the second source/drain electrodes, namely the second source electrode 34 and the second drain electrode 35, of the second TFT 30, a second through hole surrounding the second TFT 30 is formed in the second gate insulating layer 32 of the second TFT 30. In the process of forming the second source/drain electrodes, namely the second source electrode 34 and the second drain electrode 35, of the second TFT 30, the second portion 42 of the second isolation barrier 40 may be simultaneously formed, namely the second portion 42 of the second isolation barrier 40 and the second source/drain electrodes of the second TFT 30 are simultaneously formed; and it may be also understood that the second portion 42 of the second isolation barrier 40 and the second source/drain electrodes of the second TFT 30 are formed by one patterning process, and the material of the second portion 42 of the second isolation barrier 40 is the same with the material of the second source/drain electrodes of the second TFT 30.

The embodiment of the present disclosure further provides a display panel, which comprises the TFT structure provided by the above embodiment.

Exemplarily, the display panel may be a liquid crystal display (LCD) panel or an organic light-emitting diode (OLED) display panel. The display panel comprises a plurality of pixel units. Each pixel unit is provided with a TFT structure as mentioned above. By arrangement of the isolation barrier at least surrounding the active layer of the first or second TFT, for instance, the isolation barrier surrounding the first and/or second TFT, the impact of hydrogen in the first TFTs in the same pixel unit and different pixel units on the second TFT can be prevented.

The display panel has the same advantages with the TFT structure compared with the prior art. No further description will be given here.

The embodiment of the present disclosure further provides a display device, which comprises the display panel provided by the above embodiment.

The display device has the same advantages with the display panel compared with the prior art. No further description will be given here.

As shown in FIG. 4, the embodiment of the present disclosure further provides a method for manufacturing the TFT structure provided by the above embodiment, which comprises:

forming the first TFT, the second TFT and the first isolation barrier and/or the second isolation barrier on the base substrate, wherein the first active layer of the first TFT is doped with hydrogen; a material of the second active layer of the second TFT is metal oxide; the first isolation barrier at least surrounds the first active layer of the first TFT; and the second isolation barrier at least surrounds the second active layer of the second TFT.

Exemplarily, the manufacturing method comprises: S1: forming the first TFT, the second TFT and the first isolation barrier and/or the second isolation barrier on the base substrate, wherein the first active layer of the first TFT is doped with hydrogen; the material of the second active layer of the second TFT is metal oxide; the first isolation barrier at least surrounds the first active layer of the first TFT; and the second isolation barrier at least surrounds the second active layer of the second TFT.

The embodiments in the description are described in a progressive manner. Same or similar parts between the embodiments may refer to each other. Each embodiment focuses on the differences from other embodiments. In particular, as for the method embodiment, since it is basically similar to the structure embodiment, the description is relatively simple, and the relevant parts can refer to partial description of the structure embodiment.

The first TFT is an LTPS-TFT, and the second TFT is a bottom-gate TFT. When the second isolation barrier is an integral structure, that is, when the second isolation barrier is not divided into several portions, namely the second isolation barrier adopts the structure as shown in FIG. 1, with reference to FIG. 5, the step S1: forming the first TFT, the second TFT and the second isolation barrier on the base substrate, may include:

S100: forming the first TFT on the base substrate; and
S200: forming the second TFT and the second isolation barrier surrounding the second TFT on the base substrate.

Figure 6:
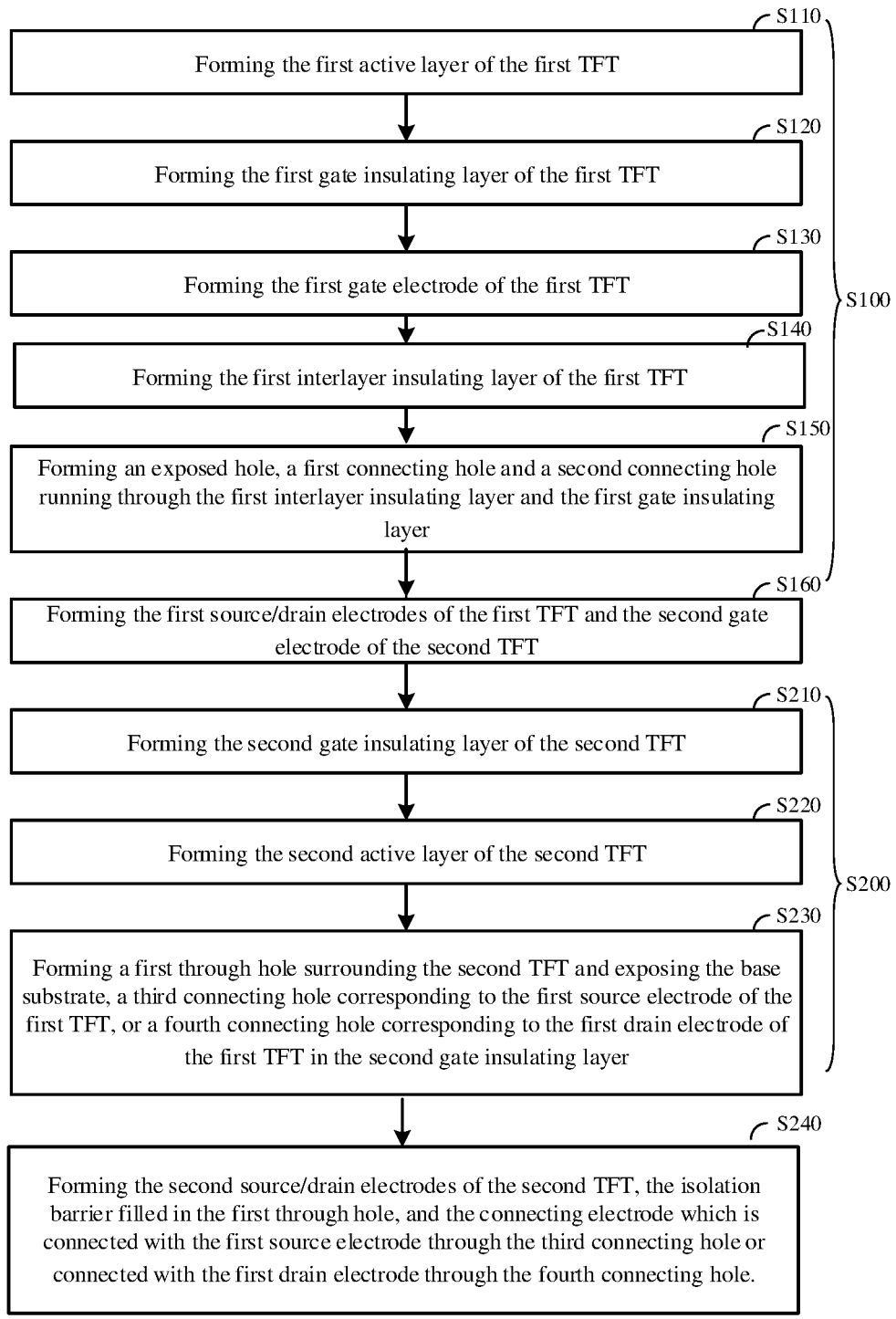
FIG. 6 is a flow chart of exemplary method of a manufacturing method of a thin-film transistor shown in FIG. 5.
Figure 7:
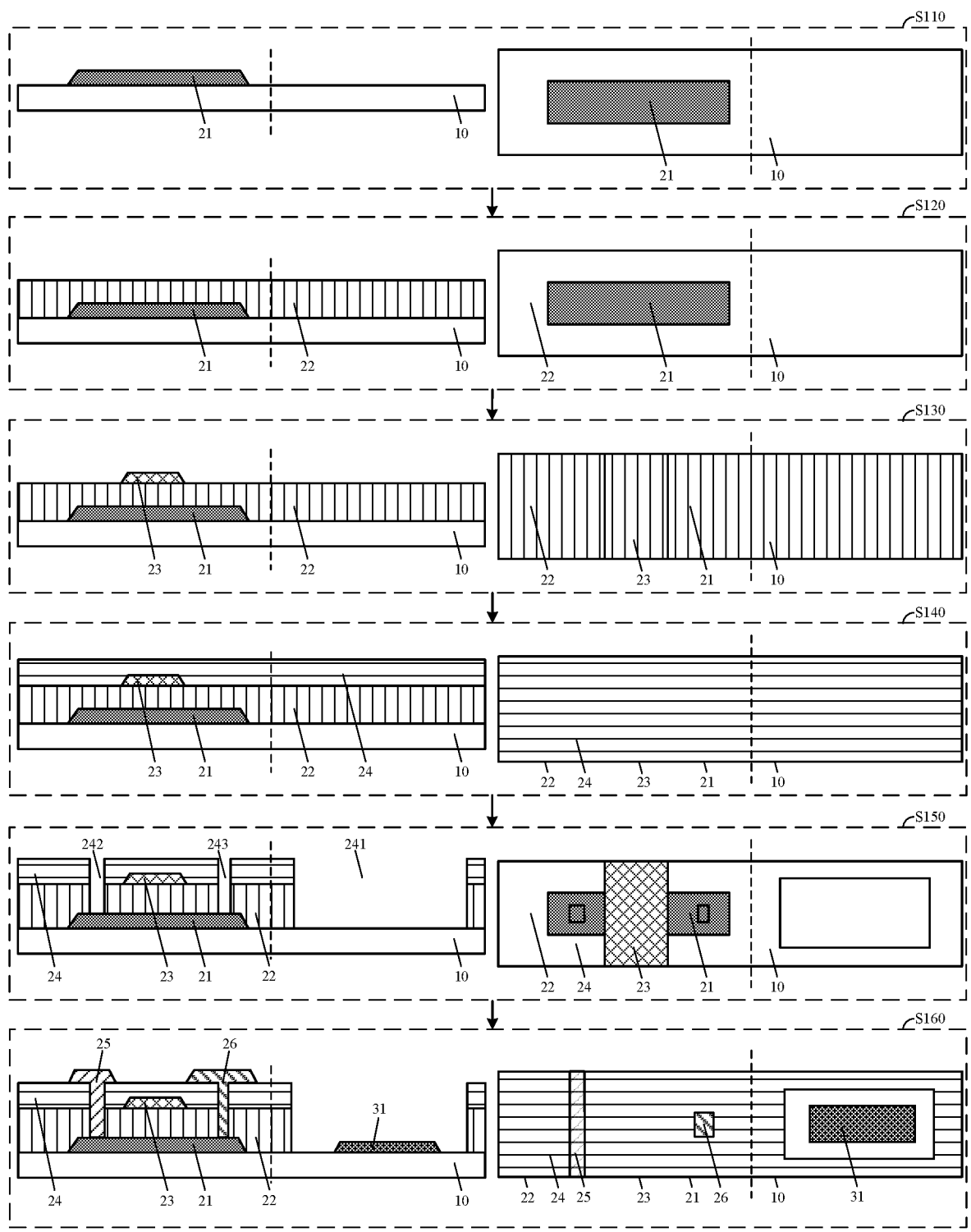
FIG. 7 is a process flow chart of step 100 in FIG. 6.

More specifically, as shown in FIGS. 6 and 7, the step S100: forming the first TFT on the base substrate, may include:

S110: forming the first active layer of the first TFT.
More specifically, as shown in FIGS. 6 and 7, in the step S110, a poly-Si layer is deposited on the base substrate 10 at first; the poly-Si layer is an LTPS layer, and the LTPS layer is doped with hydrogen; and subsequently, the first active layer 21 of the first TFT 20 is formed by a patterning process, and the first active layer 21 is disposed in the first region 11 on the base substrate 10 in which the first TFT 20 is disposed.

S120: forming the first gate insulating layer of the first TFT.

More specifically, as shown in FIGS. 6 and 7, in the step S120, a first gate insulating film layer is deposited on the base substrate 10 and the first active layer 21 to form the first gate insulating layer 22, and the first gate insulating layer 22 covers the base substrate 10 and the first active layer 21.

S130: forming the first gate electrode of the first TFT.
More specifically, as shown in FIGS. 6 and 7, in the step S130, a first metal layer is deposited on the first gate insulating layer 22 at first; and subsequently, the first gate electrode 23 of the first TFT 20 is formed by patterning process, and the first gate electrode 23 is disposed in the first region 11 of the base substrate 10 and above the first active layer 21.

S140: forming the first interlayer insulating layer of the first TFT.

More specifically, as shown in FIGS. 6 and 7, in the step S140, a first interlayer insulating film layer is deposited on the first gate insulating layer 22 and the first gate electrode 23 to form the first interlayer insulating layer 24, and the first interlayer insulating layer 24 covers the first gate insulating layer 22 and the first gate electrode 23.

S150: forming an exposed hole, a first connecting hole and a second connecting hole running through the first interlayer insulating layer and the first gate insulating layer, in which the exposed hole exposes a region on the base substrate in which the second TFT is formed; and the first active layer is exposed by both the first connecting hole and the second connecting hole.

More specifically, as shown in FIGS. 6 and 7, in the step S150, an exposed hole 241, a first connecting hole 242 and a second connecting hole 243 are formed by patterning process, in which the exposed hole 241 runs through the first interlayer insulating layer 24 and the first gate insulating layer 22 and exposes the region on the base substrate 10 in which the second TFT is formed, so as to facilitate the subsequent forming of the second TFT 30 on the base substrate 10; and the first connecting hole 242 and the second connecting hole 243 respectively run through the first interlayer insulating layer 24 and the first gate insulating layer 22 and both expose the first active layer 21, so as to facilitate the connection between the first source electrode 25 and the first drain electrode 26 of the subsequently formed first source/drain electrodes and the first active layer 21.

S160: forming the first source/drain electrodes of the first TFT and the second gate electrode of the second TFT, in which the first source/drain electrodes include the first source electrode and the first drain electrode; the first source electrode is connected with the first active layer through the first connecting hole; the first drain electrode is connected with the first active layer through the second connecting hole; and the second gate electrode is disposed on the base substrate and in the exposed hole.

More specifically, as shown in FIGS. 6 and 7, in the step S160, a second metal layer is deposited at first, and subsequently, the first source/drain electrodes of the first TFT 20 and the second gate electrode 31 of the second TFT 30 are simultaneously formed by patterning process, in which the first source electrode 25 in the first source/drain electrodes is connected with the first active layer 21 through the first connecting hole 242; the first drain electrode 26 is connected with the first active layer 21 through the second connecting hole 243; and the second gate electrode 31 is disposed on the base substrate 10 and in the exposed hole 241. That is to say, the first source/drain electrodes of the first TFT 20 and the second gate electrode 31 of the second TFT 30 are formed by one patterning process, thereby reducing the process steps of manufacturing the TFT structure, and meanwhile, reducing the number of masks used in the process of manufacturing the TFT structure, and finally reducing the production cost of the TFT structure.

Figure 8:
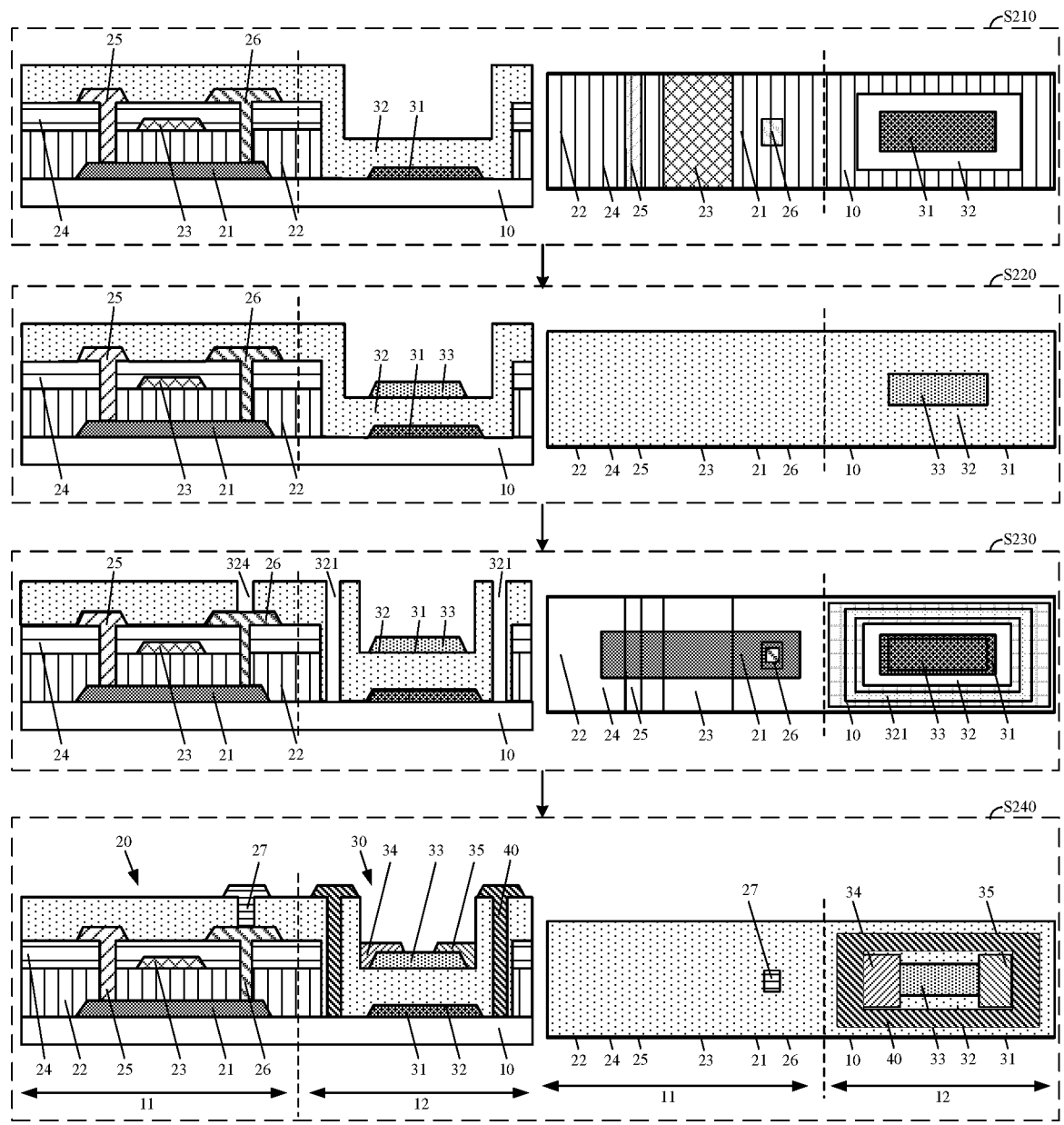
FIG. 8 is a process flow chart of step 200 in FIG. 6.

As shown in FIGS. 6 and 8, the step S200, forming the second TFT and the second isolation barrier surrounding the second TFT on the base substrate, may include:

S210: forming the second gate insulating layer of the second TFT.

More specifically, as shown in FIGS. 6 and 8, in the step S210, a second gate insulating film layer is deposited to form the second gate insulating layer 32, and the second gate insulating layer 32 covers the first TFT 20, the base substrate 10 and the second gate electrode 31.

S220: forming the second active layer of the second TFT.

More specifically, as shown in FIGS. 6 and 8, in the step S220, a metal oxide film layer is deposited on the second gate insulating layer 32 at first; and subsequently, the second active layer 33 of the second TFT 30 is formed by patterning process, and the second active layer 33 is disposed above the second gate electrode 31.

S230: forming a first through hole surrounding the second TFT and exposing the base substrate, a third connecting hole corresponding to the first source electrode of the first TFT, or a fourth connecting hole corresponding to the first drain electrode of the first TFT in the second gate insulating layer.

More specifically, as shown in FIGS. 6 and 8, in the step S230, a first through hole 321 is formed in the second gate insulating layer 32 by patterning process, and the first through hole 321 surrounds the second TFT 30 and exposes the base substrate 10, so as to facilitate the subsequent forming of the second isolation barrier 40 of the second TFT 30.

In the step S230, as shown in FIGS. 6 and 8, the third connecting hole is also formed in the second gate insulating layer by patterning process, and the third connecting hole corresponds to the first source electrode 25 of the first TFT 20, so that the first source electrode 25 can be conveniently connected with other structures through the subsequently formed connecting electrode 27; or in actual application, a fourth connecting hole 324 may also be formed in the second gate insulating layer 32 by patterning process, and the fourth connecting hole 324 corresponds to the first drain electrode 26 of the first TFT 20, so that the first drain electrode 26 may be conveniently connected with other structures through the subsequently formed connecting electrode 27.

S240: forming the second source/drain electrodes of the second TFT, the second isolation barrier filled in the first through hole, and the connecting electrode which is connected with the first source electrode through the third connecting hole or connected with the first drain electrode through the fourth connecting hole.

More specifically, as shown in FIGS. 6 and 8, in the step S240, a third metal layer is deposited at first, and subsequently, the second isolation barrier 40, the second source/drain electrodes of the second TFT 30, and the connecting electrode 27 of the first TFT 20 are simultaneously formed by patterning process, in which the second isolation barrier 40 is filled in the first through hole 321 and surrounds the second TFT 30; the second source/drain electrodes of the second TFT 30 include the second source electrode 34 and the second drain electrode 35; the second source electrode 34 and the second drain electrode 35 respectively make contact with the second active layer 33; and the connecting electrode 27 is disposed on the second gate insulating layer 32 and connected with the first source electrode 25 through the third connecting hole, or the connecting electrode 27 is connected with the first drain electrode 26 through the fourth connecting hole 324. That is to say, the second isolation barrier 40, the second source/drain electrodes and the connecting electrode 27 are formed by one patterning process, thereby reducing the process step of manufacturing the TFT structure, and meanwhile, reducing the number of masks used in the process of manufacturing the TFT structure, and finally reducing the production cost of the TFT structure.

Figure 9:
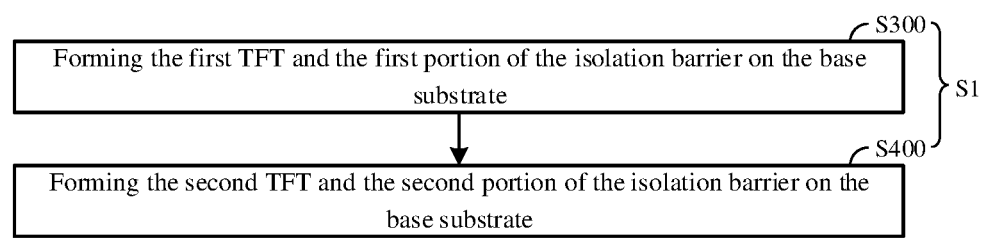
FIG. 9 is a flow chart of exemplary method of a manufacturing method of a thin-film transistor shown in FIG. 4.

The first TFT is an LTPS-TFT, and the second TFT is a bottom-gate TFT. When the second isolation barrier includes a plurality of portions, for instance, the second isolation barrier includes the first portion and the second portion, namely when the second isolation barrier adopts the structure as shown in FIG. 2, with reference to FIG. 9, the step S1, forming the first TFT, the second TFT and the second isolation barrier on the base substrate may include:

S300: forming the first TFT and the first portion of the second isolation barrier on the base substrate, in which the first portion covers an edge and a side surface of the first insulating layer of the first TFT surrounding the second TFT.

S400: forming the second TFT and the second portion of the second isolation barrier on the base substrate, in which the second portion is disposed on the first portion, and the first portion and the second portion surround the second TFT together.

Figure 10:
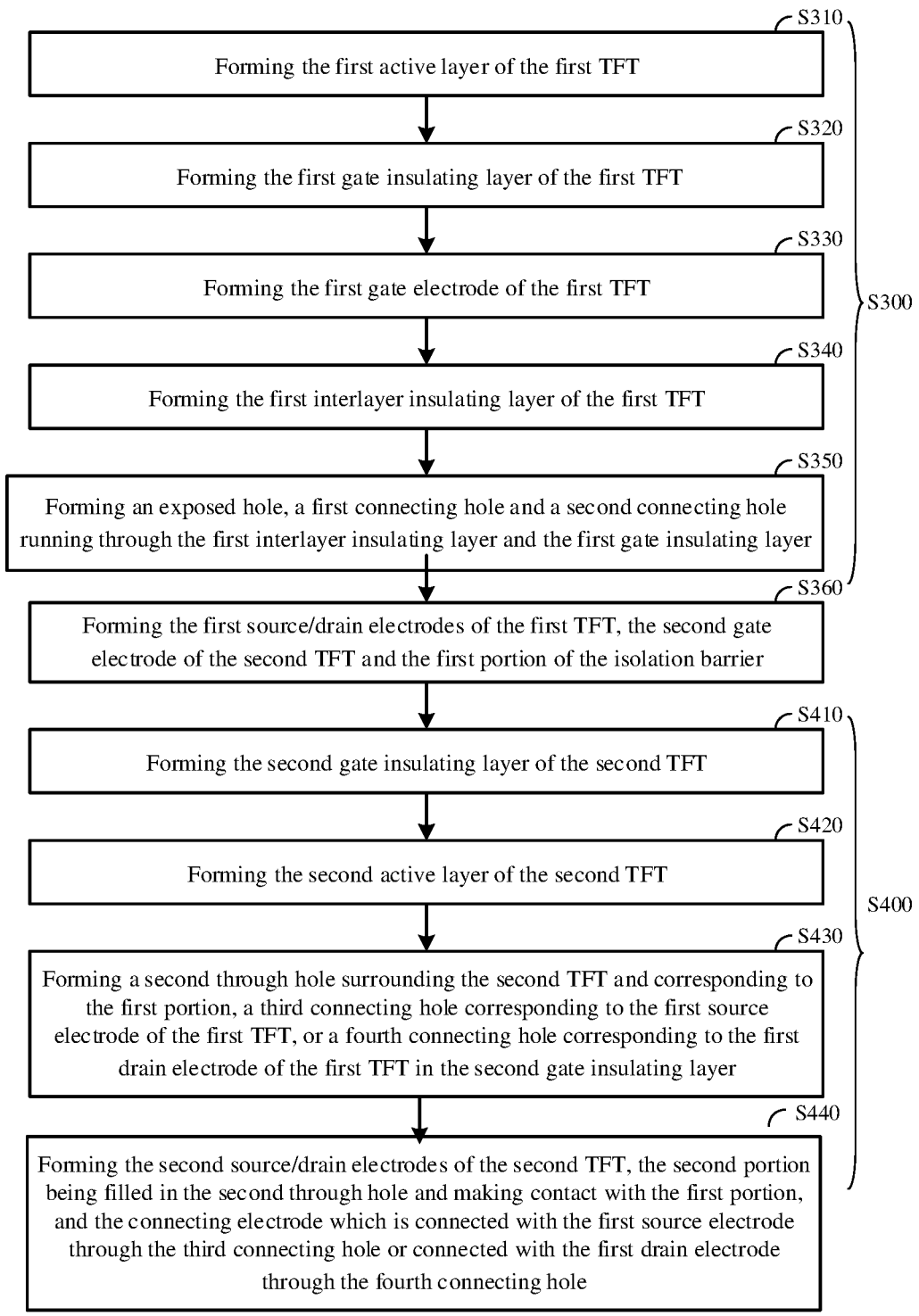
FIG. 10 is a flow chart of exemplary method of a manufacturing method of a thin-film transistor shown in FIG. 9.
Figure 11:
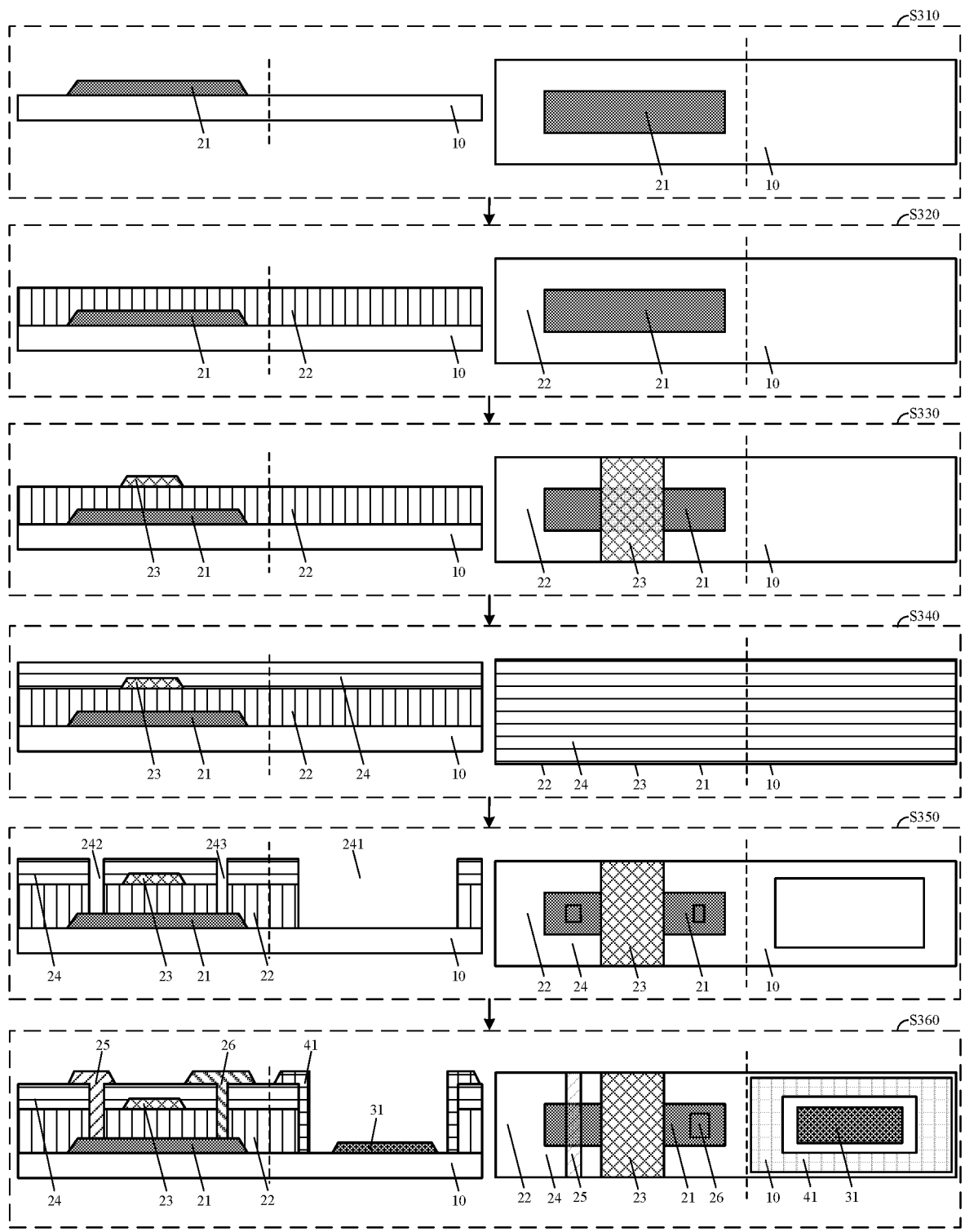
FIG. 11 is a process flow chart of step 300 in FIG. 10.

More specifically, as shown in FIGS. 10 and 11, the step S300, forming the first TFT and the first portion of the second isolation barrier on the base substrate, may include:

S310: forming the first active layer of the first TFT.

More specifically, as shown in FIGS. 10 and 11, in the step S310, a poly-Si layer is deposited on the base substrate 10 at first; the poly-Si layer is an LTPS layer, and the LTPS layer is doped with hydrogen; and subsequently, the first active layer 21 of the first TFT 20 is formed by patterning process, and the first active layer 21 is disposed in the first region 11 on the base substrate 10 in which the first TFT 20 is disposed.

S320: forming the first gate insulating layer of the first TFT.

More specifically, as shown in FIGS. 10 and 11, in the step S320, a first gate insulating film layer is deposited on the base substrate 10 and the first active layer 21 to form the first gate insulating layer 22, and the first gate insulating layer 22 covers the base substrate 10 and the first active layer 21.

S330: forming the first gate electrode of the first TFT.

More specifically, as shown in FIGS. 10 and 11, in the step S330, a first metal layer is deposited on the first gate insulating layer 22 at first; and subsequently, the first gate electrode 23 of the first TFT 20 is formed by patterning process, and the first gate electrode 23 is disposed in the first region 11 of the base substrate 10 and above the first active layer 21.

S340: forming the first interlayer insulating layer of the first TFT.

More specifically, as shown in FIGS. 10 and 11, in the step S340, a first interlayer insulating film layer is deposited on the first gate insulating layer 22 and the first gate electrode 23 to form the first interlayer insulating layer 24, and the first interlayer insulating layer 24 covers the first gate insulating layer 22 and the first gate electrode 23.

S350: forming an exposed hole, a first connecting hole and a second connecting hole running through the first interlayer insulating layer and the first gate insulating layer, in which the exposed hole exposes a region on the base substrate in which the second TFT is disposed; and both the first connecting hole and the second connecting hole expose the first active layer.

More specifically, as shown in FIGS. 10 and 11, in the step S350, an exposed hole 241, a first connecting hole 242 and a third connecting hole 243 are formed by patterning process, in which the exposed hole 241 runs through the first interlayer insulating layer 24 and the first gate insulating layer 22 and exposes the region on the base substrate 10 in which the second TFT is disposed, so as to facilitate the subsequent forming of the second TFT 30 on the base substrate 10; and the first connecting hole 242 and the second connecting hole 243 respectively run through the first interlayer insulating layer 24 and the first gate insulating layer 22 and both expose the first active layer 21, so as to facilitate the connection between the first source electrode 25 and the first drain electrode 26 in the subsequently formed first source/drain electrodes and the first active layer 21.

S360: forming the first source/drain electrodes of the first TFT, the second gate electrode of the second TFT and the first portion of the second isolation barrier, in which the first source/drain electrodes include the first source electrode and the first drain electrode; the first source electrode is connected with the first active layer through the first connecting hole; the first drain electrode is connected with the first active layer through the second connecting hole; the first portion covers an edge and a wall of the exposed hole; and the second gate electrode is disposed on the base substrate and in the exposed hole.

More specifically, as shown in FIGS. 10 and 11, in the step S360, a second metal layer is deposited at first; and subsequently, the first source/drain electrodes of the first TFT 20, the second gate electrode 31 of the second TFT 30, and the first portion 41 of the second isolation barrier 40 are simultaneously formed by patterning process, wherein in the first source/drain electrodes, the first source electrode 25 is connected with the first active layer 21 through the first connecting hole 242; the first drain electrode 26 is connected with the first active layer 21 through the second connecting hole 243; the first portion 41 of the second isolation barrier 40 covers the edge and the wall of the exposed hole 241, and more specifically, the first portion 41 covers an edge of the first interlayer insulating layer 24 corresponding to the exposed hole 241, a side surface of the first interlayer insulating layer 24 corresponding to the exposed hole 241, and a side surface of the first gate insulating layer 22 corresponding to the exposed hole 241; and the second gate electrode 31 is disposed on the base substrate 10 and in the exposed hole 241. That is to say, the first source/drain electrodes of the first TFT 20, the second gate electrode 31 of the second TFT 30, and the first portion 41 of the second isolation barrier 40 are formed by one patterning process, thereby reducing the process step of manufacturing the TFT structure, and meanwhile, reducing the number of masks used in the process of manufacturing the TFT structure, and finally reducing the production cost of the TFT structure.

Figure 12:
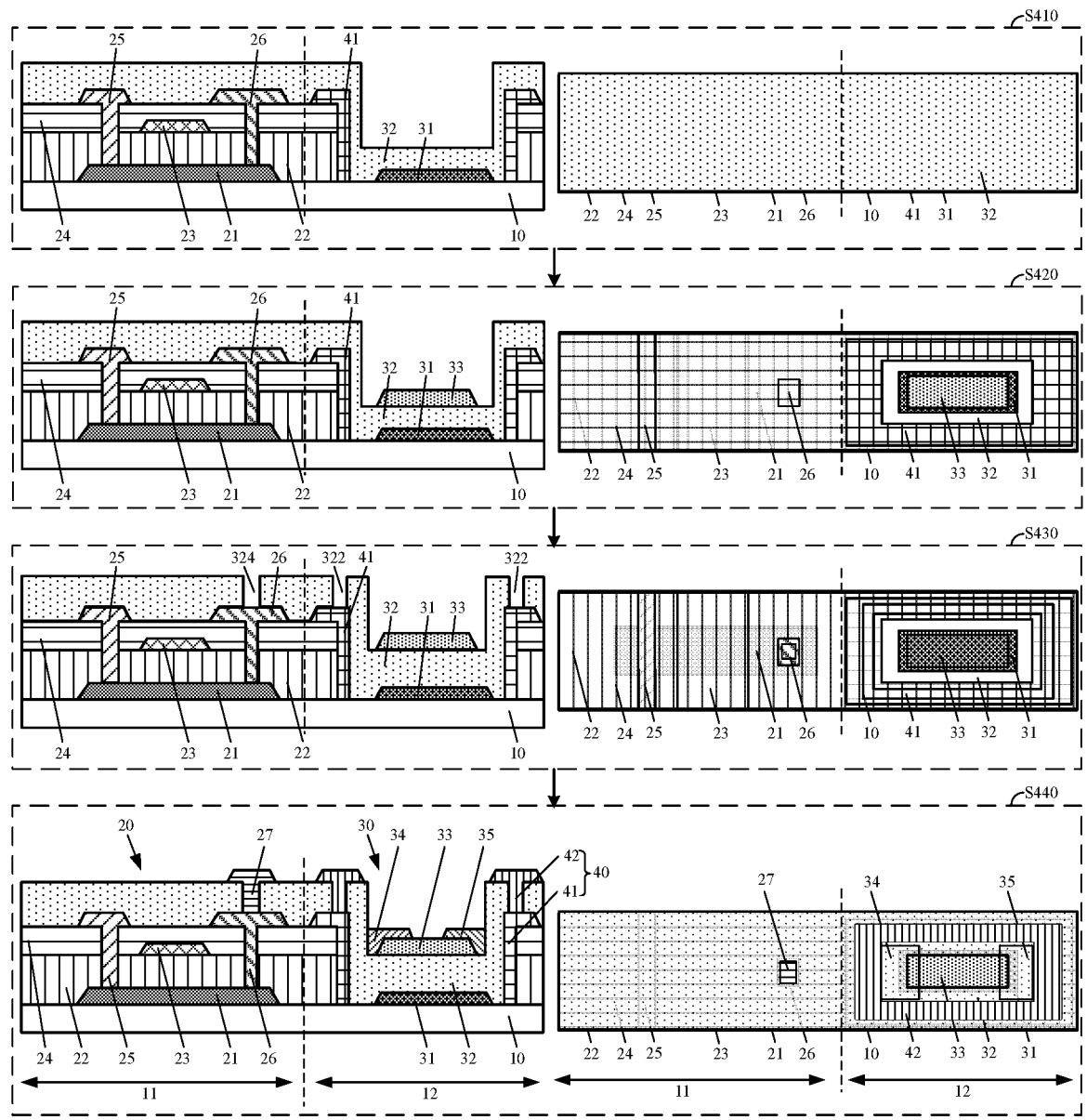
FIG. 12 is a process flow chart of step 400 in FIG. 10.

As shown in FIGS. 10 and 12, the step S400, forming the second TFT and the second portion of the second isolation barrier on the base substrate, may include:

S410: forming the second gate insulating layer of the second TFT.

More specifically, as shown in FIGS. 10 and 12, in the step S410, a second gate insulating film layer is deposited to form the second gate insulating layer 32, and the second gate insulating layer 32 covers the first TFT 20, the base substrate 10, the first portion 41 and the second gate electrode 31 of the second TFT 30.

S420: forming the second active layer of the second TFT.

More specifically, as shown in FIGS. 10 and 12, in the step S420, a metal oxide film may be deposited on the second gate insulating layer 32 at first; and subsequently, the second active layer 33 of the second TFT 30 is formed by patterning process, and the second active layer 33 is disposed above the second gate electrode 31.

S430: forming a second through hole surrounding the second TFT and corresponding to the first portion, a third connecting hole corresponding to the first source electrode of the first TFT, or a fourth connecting hole corresponding to the first drain electrode of the first TFT in the second gate insulating layer.

More specifically, as shown in FIGS. 10 and 12, in the step S430, a second through hole 322 is formed in the second gate insulating layer 32 by patterning process, and the second through hole 322 surrounds the second TFT 30 and exposes the first portion 41 of the first isolation barrier 40, so as to facilitate the subsequent forming of the second portion 42 of the second isolation barrier 40 surrounding the second TFT 30.

In the step S430, the third connecting hole is also formed in the second gate insulating layer 32 by patterning process; and the third connecting hole corresponds to the first source electrode 25 of the first TFT 20, so that the first source electrode 25 can be conveniently connected with other structures through the subsequently formed connecting electrode 27. Or, a fourth connecting hole 324 is also formed in the second gate insulating layer 32 by patterning process; and the fourth connecting hole 324 corresponds to the first drain electrode 26 of the first TFT 20, so that the first drain electrode 26 can be conveniently connected with other structures through the subsequently formed connecting electrode 27.

S440: forming the second source/drain electrodes of the second TFT, the second portion being filled in the second through hole and making contact with the first portion, and the connecting electrode which is connected with the first source electrode through the third connecting hole or connected with the first drain electrode through the fourth connecting hole.

More specifically, as shown in FIGS. 10 and 12, in the step S440, a third metal layer is deposited at first; and subsequently, the second portion 42 of the second isolation barrier 40, the second source/drain electrodes of the second TFT 30, and the connecting electrode 27 of the first TFT 20 are simultaneously formed by patterning process, wherein the second portion 42 is filled in the second through hole 322 and makes contact with the first portion 41; the first portion 41 and the second portion 42 form the second isolation barrier 40 together, so as to surround the second TFT 30 and isolate the second TFT 30 and the first TFT 20; the second source/drain electrodes of the second TFT 30 include the second source electrode 34 and the second drain electrode 35 which respectively make contact with the second active layer 33; and the connecting electrode 27 is disposed on the second gate insulating layer 32 and connected with the first source electrode 25 through the third connecting hole or connected with the first drain electrode 26 through the fourth connecting hole 324. That is to say, the second portion 42 of the second isolation barrier 40, the second source/drain electrodes and the connecting electrode 27 are formed by one patterning process, thereby reducing the process step of manufacturing the TFT structure, and meanwhile, reducing the number of masks used in the process of manufacturing the TFT structure, and finally reducing the production cost of the TFT structure.

Figure 13:
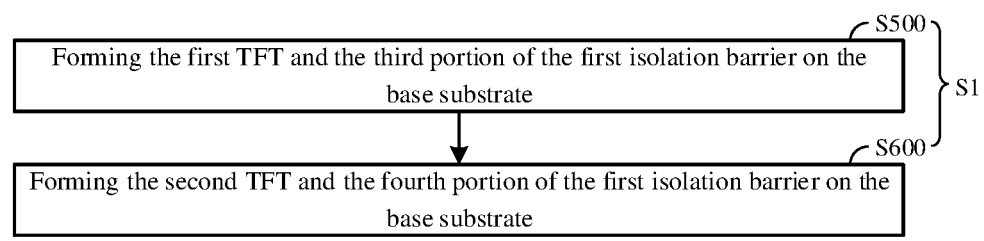
FIG. 13 is a flow chart of exemplary method of a manufacturing method of a thin-film transistor shown in FIG. 4.

The first TFT is an LTPS-TFT, and the second TFT is a bottom-gate TFT. When the first isolation barrier includes a plurality of portions, for instance, the first isolation barrier includes the third portion and the fourth portion, namely when the first isolation barrier adopts the structure as shown in FIG. 3, with reference to FIG. 13, the step S1, forming the first TFT, the second TFT and the first isolation barrier on the base substrate, may include:

S500: forming the first TFT and the third portion of the first isolation barrier on the base substrate, in which the third portion covers an edge and a side surface of the first insulating layer of the first TFT surrounding the first TFT.

S600: forming the second TFT and the fourth portion of the first isolation barrier on the base substrate, in which the fourth portion is disposed on the third portion; and the third portion and the fourth portion surround the first TFT together.

Figure 14:
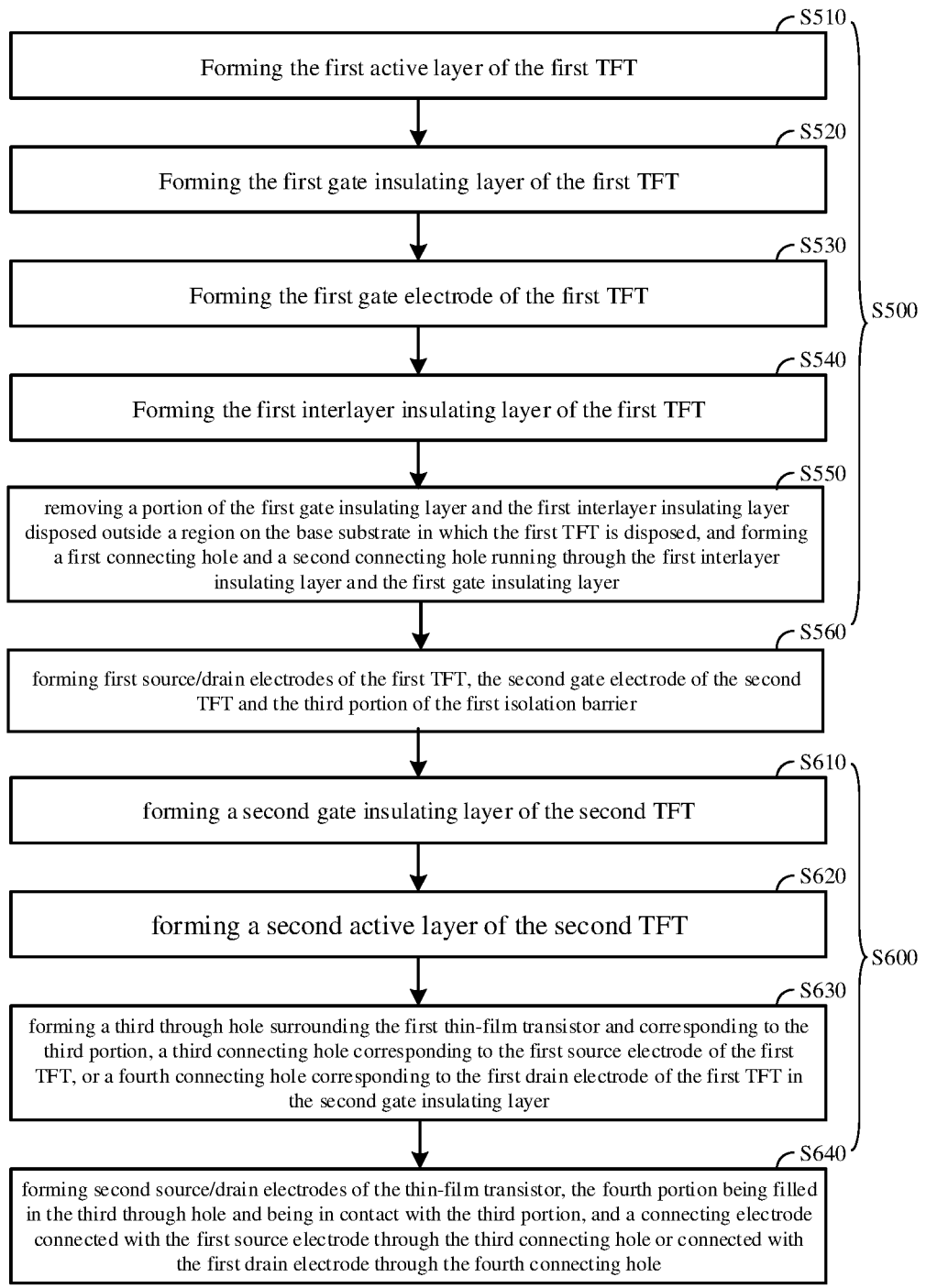
FIG. 14 is a flow chart of exemplary method of a manufacturing method of a thin-film transistor shown in FIG. 13.
Figure 15:
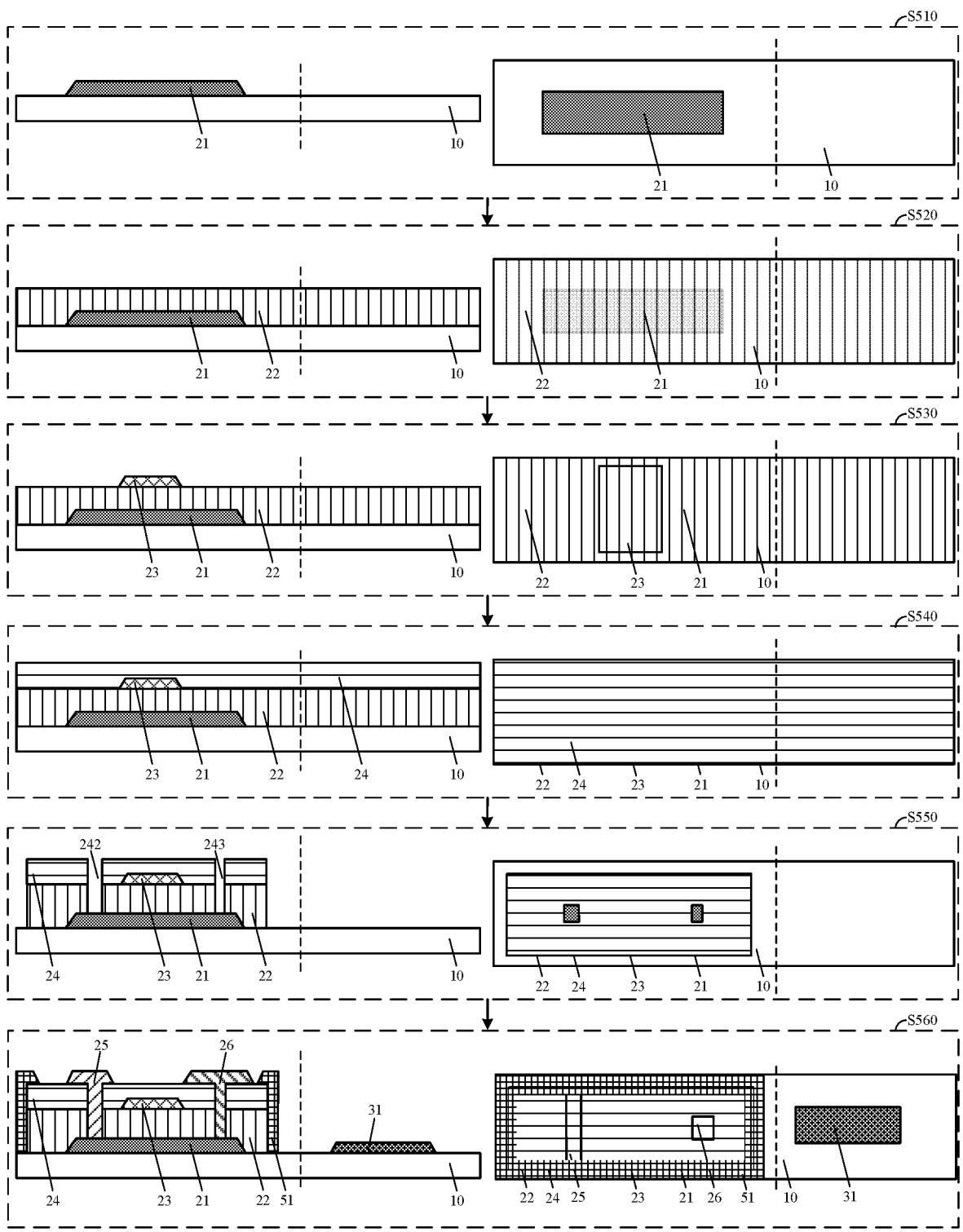
FIG. 15 is a process flow chart of step 500 in FIG. 14.

More specifically, as shown in FIGS. 14 and 15, the step S500, forming the first TFT and the third portion of the first isolation barrier, may include:

S510: forming the first active layer of the first TFT.

More specifically, as shown in FIGS. 14 and 15, in the step S510, a poly-Si layer is deposited on the base substrate 10 at first; the poly-Si layer is an LTPS layer, and the LTPS layer is doped with hydrogen; and subsequently, the first active layer 21 of the first TFT 20 is formed by patterning process, and the first active layer 21 is disposed in the first region 11 on the base substrate 10 in which the first TFT 20 is disposed.

S520: forming the first gate insulating layer of the first TFT.

More specifically, as shown in FIGS. 14 and 15, in the step S520, a first gate insulating film layer is deposited on the base substrate 10 and the first active layer 21 to form the first gate insulating layer 22, and the first gate insulating layer 22 covers the base substrate 10 and the first active layer 21.

S530: forming the first gate electrode of the first TFT.

More specifically, as shown in FIGS. 14 and 15, in the step S530, a first metal layer is deposited on the first gate insulating layer 22 at first; and subsequently, the first gate electrode 23 of the first TFT 20 is formed by patterning process, and the first gate electrode 23 is disposed in the first region 11 of the base substrate 10 and above the first active layer 21.

S540: forming the first interlayer insulating layer of the first TFT.

More specifically, as shown in FIGS. 14 and 15, in the step S540, a first interlayer insulating film layer is deposited on the first gate insulating layer 22 and the first gate electrode 23 to form the first interlayer insulating layer 24, and the first interlayer insulating layer 24 covers the first gate insulating layer 22 and the first gate electrode 23.

S550: removing a portion of the first gate insulating layer and the first interlayer insulating layer disposed outside a region on the base substrate in which the first TFT is disposed, and forming a first connecting hole and a second connecting hole running through the first interlayer insulating layer and the first gate insulating layer, in which side surfaces of the first gate insulating layer and the first interlayer insulating layer are disposed in the region of the base substrate in which the first TFT is disposed; and both the first connecting hole and the second connecting hole expose the first active layer.

More specifically, as shown in FIGS. 14 and 15, in the step S550, portions of the first gate insulating layer 22 and the first interlayer insulating layer 24, disposed outside the first region 11 on the base substrate 10 in which the first TFT 20 is disposed, are removed by patterning process, namely the portions of the first gate insulating layer 22 and the first ILD 24 disposed outside the first region 11 are removed, and a first connecting hole 242 and a second connecting hole 243 are formed, wherein the first gate insulating layer 22 only covers the first active layer 21 and the base substrate 10 disposed in the first region 11; the first interlayer insulating layer 24 covers the first gate electrode 23 and the first gate insulating layer 22; and both the first gate insulating layer 22 and the first interlayer insulating layer 24 have side surfaces surrounding the first TFT 20; and the first connecting hole 242 and the second connecting hole 243 respectively penetrate through the first interlayer insulating layer 24 and the first gate insulating layer 22 and both expose the first active layer 21, so as to facilitate the connection between the first source electrode 25 and the first drain electrode 26 in the subsequently formed first source/drain electrodes and the first active layer 21.

S560: forming the first source/drain electrodes of the first TFT, the second gate electrode of the second TFT and the third portion of the first isolation barrier, in which the first source/drain electrodes include the first source electrode and the first drain electrode; the first source electrode is connected with the first active layer through the first connecting hole; the first drain electrode is connected with the first active layer through the second connecting hole; the third portion covers an edge and a side surface of the first interlayer insulating layer and a side surface of the first gate insulating layer; and the second gate electrode is disposed on the base substrate.

More specifically, as shown in FIGS. 14 and 15, in the step S560, a second metal layer is deposited; and subsequently, the first source/drain electrodes of the first TFT 20, the second gate electrode 31 of the second TFT 30 and the third portion 51 of the first isolation barrier 50 are simultaneously formed by patterning process, wherein, in the first source/drain electrodes, the first source electrode 25 is connected with the first active layer 21 through the first connecting hole 242; the first drain electrode 26 is connected with the first active layer 21 through the second connecting hole 243; the third portion 51 of the first isolation barrier 50 covers an edge and a side surface of the first interlayer insulating layer 24 and a side surface of the first gate insulating layer 22; and the second gate electrode 31 is disposed on the base substrate 10 and in the second region 12. That is to say, the first source/drain electrodes of the first TFT 20, the second gate electrode 31 of the second TFT 30 and the third portion 51 of the first isolation barrier 50 are formed by one patterning process, thereby reducing the process step of manufacturing the TFT structure, and meanwhile, reducing the number of masks used in the process of manufacturing the TFT structure, and finally reducing the production cost of the TFT structure.

Figure 16:
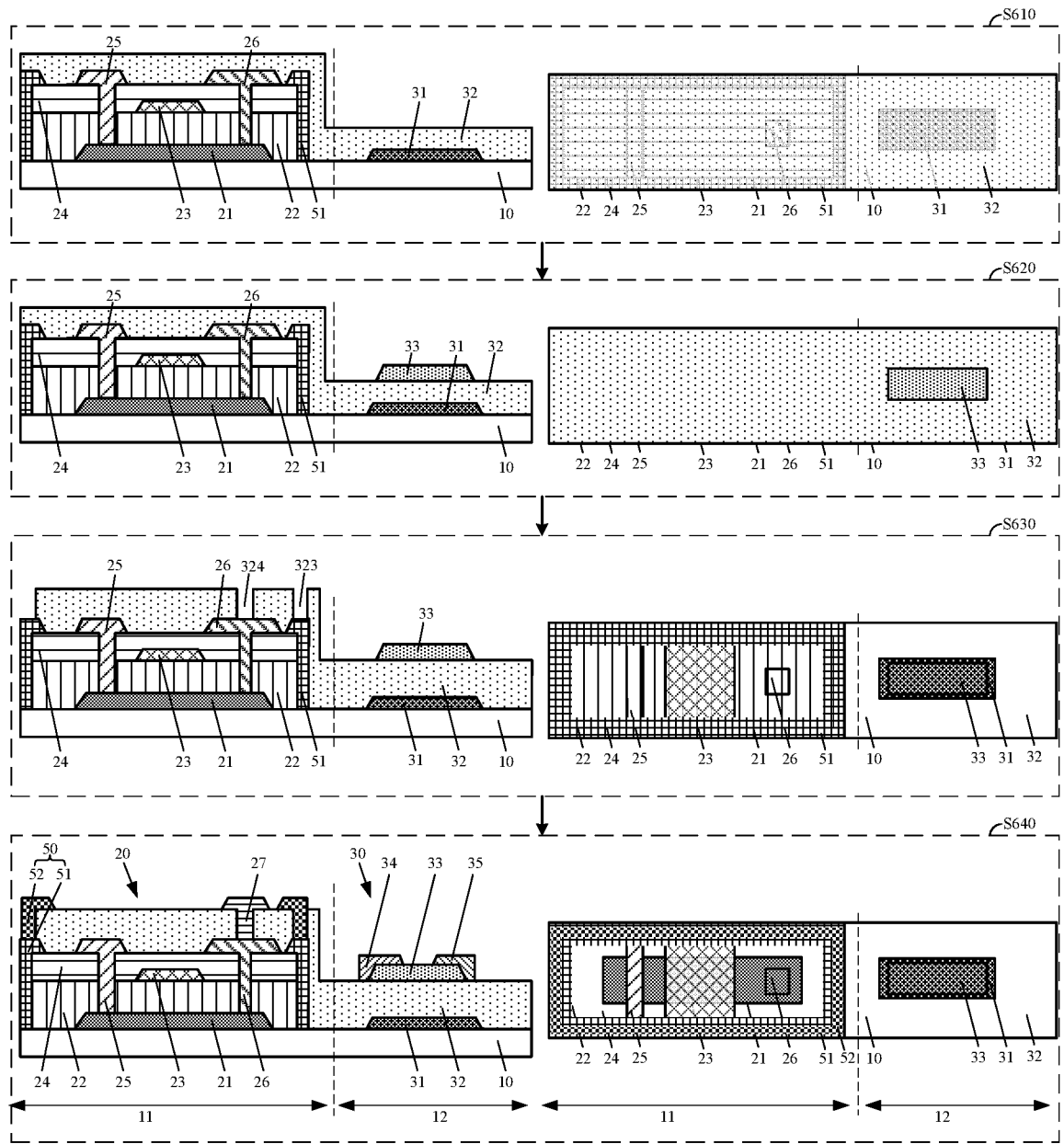
FIG. 16 is a process flow chart of step 600 in FIG. 14.

As shown in FIGS. 14 and 16, the step S600, forming the second TFT and the fourth portion of the first isolation barrier on the base substrate, may include:

S610: forming the second gate insulating layer of the second TFT.

More specifically, as shown in FIGS. 14 and 16, in the step S610, a second gate insulating film layer is deposited to form the second gate insulating layer 32, and the second gate insulating layer 32 covers the first TFT 20, the base substrate 10, the third portion 51 and the second gate electrode 31 of the second TFT 30.

S620: forming the second active layer of the second TFT.

More specifically, as shown in FIGS. 14 and 16, in the step S620, a metal oxide film layer may be deposited on the second gate insulating layer 32 at first; and subsequently, the second active layer 33 of the second TFT 30 is formed by patterning process, and the second active layer 33 is disposed above the second gate electrode 31.

S630: forming a third through hole surrounding the first TFT and corresponding to the third portion, a third connecting hole corresponding to the first source electrode of the first TFT, or a fourth connecting hole corresponding to the first drain electrode of the first TFT in the second gate insulating layer.

More specifically, as shown in FIGS. 14 and 16, in the step S630, a third through hole 323 is formed in the second gate insulating layer 32 by patterning process, and the third through hole 323 surrounds the first TFT 20 and exposes the third portion 51 of the first isolation barrier 50, so as to facilitate the subsequent forming of the fourth portion 52 of the first isolation barrier 50 surrounding the first TFT 20.

In the step S630, the third connecting hole is also formed in the second gate insulating layer 32 by patterning process; and the third connecting hole corresponds to the first source electrode 25 of the first TFT 20, so that the first source electrode 25 can be conveniently connected with other structures through the subsequently formed connecting electrode 27. Or, a fourth connecting hole 324 is also formed in the second gate insulating layer 32 by patterning process; and the fourth connecting hole 324 corresponds to the first drain electrode 26 of the first TFT 20, so that the first drain electrode 26 can be conveniently connected with other structures through the subsequently formed connecting electrode 27.

S640: forming the second source/drain electrodes of the second TFT, the fourth portion being filled in the third through hole and making contact with the third portion, and the connecting electrode which is connected with the first source electrode through the third connecting hole or connected with the first drain electrode through the fourth connecting hole.

More specifically, as shown in FIGS. 14 and 16, in the step S640, a third metal layer is deposited at first; and subsequently, the fourth portion 52 of the first isolation barrier 50, the second source/drain electrodes of the second TFT 30, and the connecting electrode 27 of the first TFT 20 are simultaneously formed by patterning process, in which the fourth portion 52 is filled in the third through hole 323 and makes contact with the third portion 51; the third portion 51 and the fourth portion 52 form the first isolation barrier 50 together, so as to surround the first TFT 20 and isolate the second TFT 30 and the first TFT 20; the second source/drain electrodes of the second TFT 30 include the second source electrode 34 and the second drain electrode 35 which respectively make contact with the second active layer 33; and the connecting electrode 27 is disposed on the second gate insulating layer 32 and connected with the first source electrode 25 through the third connecting hole or connected with the first drain electrode 26 through the fourth connecting hole 324. That is to say, the fourth portion 52 of the first isolation barrier 50, the second source/drain electrodes and the connecting electrode 27 are formed by one patterning process, thereby reducing the process step of manufacturing the TFT structure, and meanwhile, reducing the number of masks used in the process of manufacturing the TFT structure, and finally reducing the production cost of the TFT structure.

As for a method for manufacturing a TFT structure with both of a first isolation barrier 50 and a second isolation barrier 40, manufacturing methods of the first isolation barrier 50 and the second isolation barrier 40 may respectively refer to the above embodiment. For instance, when the first isolation barrier 50 has a structure as shown in FIG. 3 and the second isolation barrier 40 has a structure as shown in FIG. 1, the first isolation barrier and the second isolation barrier may be formed with reference to the manufacturing methods as shown in FIGS. 15 and 16 and FIGS. 7 and 8, wherein a filling hole of the second isolation barrier 40 may be formed in a process of forming a second portion of the first isolation barrier 50. For instance, when the first isolation barrier 50 has the structure as shown in FIG. 3 and the second isolation barrier 40 has the structure as shown in FIG. 2, the first isolation barrier and the second isolation barrier may be formed with reference to FIGS. 11 and 12 and FIGS. 15 and 16. Exemplarily, the first isolation barrier 50 and the second isolation barrier 40 may share an isolation barrier on a boundary thereof; or at the boundary thereof, the third portion of the first isolation barrier 50 may be formed after forming the first portion of the second isolation barrier; or the third portion of the first isolation barrier 50 may be formed before forming the first portion of the second isolation barrier, and the subsequently formed third portion or first portion may cover part or all of the first portion or the third portion in a direction perpendicular to the base substrate, that is, being overlapped in a direction perpendicular to the base substrate. Optionally, the subsequently formed third portion or first portion may not cover the previously formed first portion or third portion in the direction perpendicular to the base substrate, but only overlapped in a direction parallel to the base substrate. No limitation will be given here in the embodiment of the present disclosure.

In the above embodiments, the described feature, structure, material or character may be combined in any suitable manner in any or a plurality of embodiments or examples.

What are described above is related to the specific embodiments of the disclosure only and not limitative to the scope of the disclosure. Any modification and equivalent replacement may be made by those skilled in the art within the substantial protection scope of the embodiments of the present disclosure, which is regarded as falling within the protection scope of embodiments of the present disclosure. The protection scope of the disclosure shall be based on the protection scope of the claims.

The application claims priority to the Chinese patent application No. 201710629740.5, filed Jul. 28, 2017, the disclosure of which is incorporated herein by reference as part of the application.

The invention claimed is:

1. A thin-film transistor structure, comprising:
   a base substrate; and
   a first thin-film transistor and a second thin-film transistor, formed on the base substrate, wherein
   a first active layer of the first thin-film transistor is doped with hydrogen; a material of a second active layer of the second thin-film transistor is metal oxide; and a first isolation barrier surrounding the first thin-film transistor and/or a second isolation barrier surrounding the second thin-film transistor are disposed on the base substrate.

2. The thin-film transistor structure according to claim 1, wherein a second gate insulating layer of the second thin-film transistor covers the first thin-film transistor; a first through hole surrounding the second thin-film transistor is disposed in the second gate insulating layer; and the second isolation barrier is filled into the first through hole.

3. The thin-film transistor structure according to claim 2, wherein the first thin-film transistor is a low temperature polysilicon thin-film transistor; and the second thin-film transistor is a bottom-gate thin-film transistor.

4. The thin-film transistor structure according to claim 3, wherein the first thin-film transistor includes a connecting electrode disposed on the second gate insulating layer; the connecting electrode is connected with a drain electrode of first source/drain electrodes in the first thin-film transistor through a first connecting hole in the second gate insulating layer; or, the connecting electrode is connected with a source electrode of the first source/drain electrodes in the first thin-film transistor through a second connecting hole in the second gate insulating layer.

5. The thin-film transistor structure according to claim 1, wherein the second isolation barrier includes a first portion and a second portion;
the first portion is disposed on the base substrate and covers an edge and a side surface of a first insulating layer of the first thin-film transistor surrounding the second thin-film transistor; and
a second gate insulating layer of the second thin-film transistor covers the first thin-film transistor and the first portion; a region of the second gate insulating layer corresponding to the first portion is provided with a second through hole surrounding the second thin-film transistor; the second portion is filled into the second through hole; and the second portion is in contact with the first portion.

6. The thin-film transistor structure according to claim 1, wherein the first isolation barrier includes a third portion and a fourth portion, in which
the third portion is disposed on the base substrate and covers an edge and a side surface of a first insulating layer of the first thin-film transistor, being disposed on the base substrate and formed in a region of the first thin-film transistor and surrounding the first thin-film transistor;
a second gate insulating layer of the second thin-film transistor covers the first thin-film transistor and the third portion; a region of the second gate insulating layer corresponding to the third portion is provided with a third through hole surrounding the first thin-film transistor; the fourth portion is filled into the third through hole; and the fourth portion is in contact with the third portion.

7. The thin-film transistor structure according to claim 6, wherein the first insulating layer includes the first gate insulating layer of the first thin-film transistor and a first interlayer insulating layer covering the first gate electrode of the first thin-film transistor.

8. The thin-film transistor structure according to claim 7, wherein the third portion covering the edge and the side surface of the first insulating layer of the first thin-film transistor, being disposed on the base substrate and formed in a region of the first thin-film transistor and surrounding the first thin-film transistor, includes:
the third portion covering a side surface of the first gate insulating layer of the first thin-film transistor, being disposed on the base substrate and formed in the region of the first thin-film transistor and surrounding the first thin-film transistor, and the third portion covering an edge and a side surface of the first interlayer insulating layer of the first thin-film transistor, being disposed on the base substrate and formed in the region of the first thin-film transistor and surrounding the first thin-film transistor.

9. The thin-film transistor structure according to claim 1, wherein the first isolation barrier is an organic material isolation barrier, an inorganic material isolation barrier or a metal isolation barrier; and
the second isolation barrier is an organic material isolation barrier, an inorganic material isolation barrier or a metal isolation barrier.

10. A display panel, comprising the thin-film transistor structure according to claim 1.

11. A display device, comprising the display panel according to claim 10.

12. A method for manufacturing the thin-film transistor structure according to claim 1, comprising:
forming a first thin-film transistor, a second thin-film transistor and a first isolation barrier and/or a second isolation barrier on a base substrate, in which a first active layer of the first thin-film transistor is doped with hydrogen; a material of a second active layer of the second thin-film transistor is metal oxide; the first isolation barrier surrounds the first thin-film transistor; and the second isolation barrier surrounds the second thin-film transistor.

13. The method for manufacturing the thin-film transistor structure according to claim 12, wherein the first thin-film transistor is a low temperature polysilicon thin-film transistor; and the second thin-film transistor is a bottom-gate thin-film transistor; and
the forming the first thin-film transistor, the second thin-film transistor and the second isolation barrier on the base substrate includes:
forming the first thin-film transistor on the base substrate; and
forming the second thin-film transistor and the second isolation barrier surrounding the second thin-film transistor on the base substrate.

14. The method for manufacturing the thin-film transistor structure according to claim 13, wherein
the forming the first thin-film transistor on the base substrate includes:
forming a first active layer of the first thin-film transistor;
forming a first gate insulating layer of the first thin-film transistor;
forming a first gate electrode of the first thin-film transistor;
forming a first interlayer insulating layer of the first thin-film transistor;
forming an exposed hole, a first connecting hole and a second connecting hole running through the first interlayer insulating layer and the first gate insulating layer, in which the exposed hole exposes a region on the base substrate in which the second thin-film transistor is disposed; the first active layer is exposed by both the first connecting hole and the second connecting hole; and
forming first source/drain electrodes of the first thin-film transistor and a second gate electrode of the second thin-film transistor, in which the first source/drain electrodes include a first source electrode and a first drain electrode; the first source electrode is connected with the first active layer through the first connecting hole; the first drain electrode is connected with the first active layer through the second connecting hole; the second gate electrode is disposed on the base substrate and in the exposed hole; and the forming the second thin-film transistor and the second isolation barrier surrounding the second thin-film transistor on the base substrate includes:
- forming a second gate insulating layer of the second thin-film transistor;
- forming a second active layer of the second thin-film transistor;
- forming a first through hole surrounding the second thin-film transistor and exposing the base substrate, a third connecting hole corresponding to the first source electrode of the first thin-film transistor, or a fourth connecting hole corresponding to the first drain electrode of the first thin-film transistor in the second gate insulating layer; and
- forming second source/drain electrodes of the second thin-film transistor, the second isolation barrier filled into the first through hole, and a connecting electrode which is connected with the first source electrode through the third connecting hole or connected with the first drain electrode through the fourth connecting hole.

15. The method for manufacturing the thin-film transistor structure according to claim 12, wherein the first thin-film transistor is a low temperature polysilicon thin-film transistor; and the second thin-film transistor is a bottom-gate thin-film transistor; and the forming the first thin-film transistor, the second thin-film transistor and the second isolation barrier on the base substrate includes:
- forming the first thin-film transistor and a first portion of the second isolation barrier on the base substrate, in which the first portion covers an edge and a side surface of the first insulating layer of the first thin-film transistor surrounding the second thin-film transistor; and
- forming the second thin-film transistor and a second portion of the second isolation barrier on the base substrate, in which the second portion is disposed on the first portion, and the first portion and the second portion surround the second thin-film transistor together.

16. The method for manufacturing the thin-film transistor structure according to claim 15, wherein the forming the first thin-film transistor and the first portion of the second isolation barrier on the base substrate includes:
- forming a first active layer of the first thin-film transistor;
- forming a first gate insulating layer of the first thin-film transistor;
- forming a first gate electrode of the first thin-film transistor;
- forming a first interlayer insulating layer of the first thin-film transistor;
- forming an exposed hole, a first connecting hole and a second connecting hole running through the first interlayer insulating layer and the first gate insulating layer, in which the exposed hole exposes a region on the base substrate in which the second thin-film transistor is disposed, and the first active layer is exposed by both the first connecting hole and the second connecting hole; and
- forming first source/drain electrodes of the first thin-film transistor, a second gate electrode of the second thin-film transistor and the first portion of the second isolation barrier, in which the first source/drain electrodes include a first source electrode and a first drain electrode; the first source electrode is connected with the first active layer through the first connecting hole; the first drain electrode is connected with the first active layer through the second connecting hole; the first portion covers an edge and a wall of the exposed hole; the second gate electrode is disposed on the base substrate and in the exposed hole; and the forming the second thin-film transistor and the second portion of the second isolation barrier on the base substrate includes:
- forming a second gate insulating layer of the second thin-film transistor;
- forming a second active layer of the second thin-film transistor;
- forming a second through hole surrounding the second thin-film transistor and corresponding to the first portion, a third connecting hole corresponding to the first source electrode of the first thin-film transistor, or a fourth connecting hole corresponding to the first drain electrode of the first thin-film transistor in the second gate insulating layer; and
- forming second source/drain electrodes of the second thin-film transistor, the second portion being filled into the second through hole and being in contact with the first portion, and a connecting electrode which is connected with the first source electrode through the third connecting hole or connected with the first drain electrode through the fourth connecting hole.

17. The method for manufacturing the thin-film transistor structure according to claim 12, wherein the first thin-film transistor is a low temperature polysilicon thin-film transistor; and the second thin-film transistor is a bottom-gate thin-film transistor; and the forming the first thin-film transistor, the second thin-film transistor and the first isolation barrier on the base substrate includes:
- forming the first thin-film transistor and a third portion of the first isolation barrier on the base substrate, in which the third portion covers an edge and a side surface of the first insulating layer of the first thin-film transistor surrounding the first thin-film transistor; and
- forming the second thin-film transistor and a fourth portion of the first isolation barrier on the base substrate, in which the fourth portion is disposed on the third portion, and the third portion and the fourth portion surround the first thin-film transistor together.

18. The method for manufacturing the thin-film transistor structure according to claim 17, wherein the forming the first thin-film transistor and the third portion of the isolation barrier on the base substrate includes:
- forming a first active layer of the first thin-film transistor;
- forming a first gate insulating layer of the first thin-film transistor;
- forming a first gate electrode of the first thin-film transistor;
- forming a first interlayer insulating layer of the first thin-film transistor;
- removing a portion of the first gate insulating layer and the first interlayer insulating layer disposed outside a region of the base substrate in which the first thin-film transistor is disposed, and forming a first connecting hole and a second connecting hole running through the first interlayer insulating layer and the first gate insulating layer, in which side surfaces of the first gate insulating layer and the first interlayer insulating layer are disposed in the region of the base substrate in which the first thin-film transistor is disposed; the first active layer is exposed by both the first connecting hole and the second connecting hole; and forming first source/drain electrodes of the first thin-film transistor, the second gate electrode of the second thin-film transistor and the third portion of the first isolation barrier, in which the first source/drain electrodes include a first source electrode and a first drain electrode; the first source electrode is connected with the first active layer through the first connecting hole; the first drain electrode is connected with the first active layer through the second connecting hole; the third portion covers an edge and the side surface of the first interlayer insulating layer and the side surface of the first gate insulating layer; the second gate electrode is disposed on the base substrate; and the forming the second thin-film transistor and the fourth portion of the first isolation barrier on the base substrate includes:

forming a second gate insulating layer of the second thin-film transistor;

forming a second active layer of the second thin-film transistor;

forming a third through hole surrounding the first thin-film transistor and corresponding to the third portion, a third connecting hole corresponding to the first source electrode of the first thin-film transistor, or a fourth connecting hole corresponding to the first drain electrode of the first thin-film transistor in the second gate insulating layer; and forming second source/drain electrodes of the second thin-film transistor, the fourth portion being filled in the third through hole and being in contact with the third portion, and a connecting electrode which is connected with the first source electrode through the third connecting hole or connected with the first drain electrode through the fourth connecting hole.

* * * * *